United States Patent
Lee et al.

(10) Patent No.: US 9,757,895 B2
(45) Date of Patent: Sep. 12, 2017

(54) PATTERNING METHOD USING IMPRINT MOLD, PATTERN STRUCTURE FABRICATED BY THE METHOD, AND IMPRINTING SYSTEM

(71) Applicant: Samsung Electronics Co., Ltd., Suwon-si, Gyeonggi-do (KR)

(72) Inventors: Sunghoon Lee, Seoul (KR); Dongouk Kim, Pyeongtaek-si (KR); Joonyong Park, Suwon-si (KR); Jihyun Bae, Seoul (KR); Bongsu Shin, Seoul (KR); Hongseok Lee, Seongnam-si (KR); Jaeseung Chung, Seoul (KR); Sukgyu Hahm, Gyeongsangbuk-do (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 140 days.

(21) Appl. No.: 14/633,272

(22) Filed: Feb. 27, 2015

(65) Prior Publication Data
US 2015/0321415 A1    Nov. 12, 2015

(30) Foreign Application Priority Data
May 7, 2014 (KR) .................. 10-2014-0054429

(51) Int. Cl.
| | |
|---|---|
| *B29C 59/02* | (2006.01) |
| *G02B 5/30* | (2006.01) |
| *G03F 7/00* | (2006.01) |
| *G02B 1/12* | (2006.01) |
| *B29K 25/00* | (2006.01) |
| *B29K 33/00* | (2006.01) |

(52) U.S. Cl.
CPC .......... *B29C 59/026* (2013.01); *G02B 5/3058* (2013.01); *G02B 5/3066* (2013.01);
(Continued)

(58) Field of Classification Search
CPC ..... B29C 59/026; B29C 59/04; G02B 5/3058; G02B 5/3066; G03F 7/0002
See application file for complete search history.

(56) References Cited

U.S. PATENT DOCUMENTS

2005/0005801 A1* 1/2005 Thallner ................ B82Y 10/00
                                                               101/483
2006/0246169 A1   11/2006 Chen et al.
(Continued)

FOREIGN PATENT DOCUMENTS

| CN | 1693182 A | 11/2005 |
| CN | 102275445 A | 12/2011 |

(Continued)

OTHER PUBLICATIONS

European Search Report for European Patent Application No. 15166555.1 dated Jun. 30, 2016.
(Continued)

*Primary Examiner* — Stella Yi
(74) *Attorney, Agent, or Firm* — Cantor Colburn LLP

(57) ABSTRACT

A patterning method using an imprint mold, to form an imprinted pattern structure, includes providing a resist layer from which the pattern structure will be formed, performing a first imprint process on a first area of the resist layer by using the imprint mold to form a first pattern of the pattern structure through deformation of the resist layer in the first area, and performing a second imprint process on a second area of the resist layer by using the imprint mold to form a second pattern of the pattern structure through deformation of the resist layer in the second area. The first and second areas are overlapped with each other in a third area of the resist layer, and the performing the second imprint process deforms a first portion of the first pattern in the third area to form the second pattern.

18 Claims, 22 Drawing Sheets

(52) U.S. Cl.
 CPC ........ *G03F 7/0002* (2013.01); *B29K 2025/06* (2013.01); *B29K 2033/12* (2013.01); *G02B 1/12* (2013.01); *G02B 2207/101* (2013.01); *Y10T 428/2457* (2015.01)

(56) References Cited

U.S. PATENT DOCUMENTS

| | | |
|---|---|---|
| 2011/0068504 A1 | 3/2011 | Tobise |
| 2012/0061882 A1 | 3/2012 | Furutono et al. |
| 2013/0120698 A1 | 5/2013 | Takakuwa et al. |
| 2013/0153124 A1 | 6/2013 | Hubert |
| 2013/0153534 A1 | 6/2013 | Resnick et al. |

FOREIGN PATENT DOCUMENTS

| | | |
|---|---|---|
| KR | 1020120111712 A | 10/2012 |
| KR | 10-1316469 B1 | 10/2013 |
| WO | 2009093700 A1 | 7/2009 |

OTHER PUBLICATIONS

Ito, et al., "Vinyl ether resist system for UV-cured nanoimprint lithography", Optical Sensing II, vol. 6153, 2006.

Lan et al., "UV-Nanoimprint Lithography: Structure, Materials and Fabrication of Flexible Molds", Journal of Nanoscience and Nanotechnology, vol. 13, No. 5, 2013.

Schleunitz et al., "Fabrication of mesas with micro-and nanopatterned surface relief used as working tamps for step and stamp imprint lithography", Journal of Vacuum Science and Technology, Part B, vol. 28, No. 6, 2010.

Schift H., "Nanoimprint Lithography-Patterning of Resists using Molding", Springer Handbook of Nanotechnology, 3rd Ed., 2010, pp. 271-312.

Partial European Search Report for European Patent Application No. 15166555.1 dated Feb. 26, 2016.

Schleunitz Arne et al., "Fabrication of mesas with micro-and nanopatterned surface relief used as working stamps for step and stamp imprint lithography", Journal of Vacuum Science and Technology, Part B, vol. 28, No. 6, 2010, pp. C6M37-C6M40.

\* cited by examiner

PATTERNING METHOD USING IMPRINT MOLD, PATTERN STRUCTURE FABRICATED BY THE METHOD, AND IMPRINTING SYSTEM

CROSS-REFERENCE TO RELATED APPLICATIONS

This application claims priority to Korean Patent Application No. 10-2014-0054429, filed on May 7, 2014, and all the benefits accruing therefrom under 35 U.S.C. §119, the disclosure of which is incorporated herein in its entirety by reference.

BACKGROUND

1. Field

The invention relates to a patterning method using an imprint mold, a pattern structure fabricated by the method, and an imprinting system.

2. Description of the Related Art

Polarizers refer to optical elements that convert non-polarized or randomly polarized electromagnetic waves to electromagnetic waves of a single polarization. A typical example of a polarizer is a polyvinyl alcohol ("PVA") polarizer that is an absorption type polarizer used for a thin film transistor-liquid crystal display ("TFT-LCD"). The PVA polarizer is provided on an upper display substrate and/or a lower display substrate of a display panel to transmit or block light irradiated by a backlight unit ("BLU"), and thus plays a core role in driving the display panel.

SUMMARY

Unlike an absorption type polarizer that absorbs an S-polarized wave and transmits a P-polarized wave, a metal wire grid polarizer ("WGP") that is a reflection type polarizer characteristically reflects an S-polarized wave and transmits a P-polarized wave. Accordingly, when the WGP is applied to a thin film transistor-liquid crystal display ("TFT-LCD"), the S-polarized wave reflected from a surface of the metal WGP is recycled and thus brightness may be improved and costs for a light source may be reduced. As the size of a display panel gradually increases, a demand for a defectless, large-size metal WGP also increases. To this end, a master manufacturing technology using a large-size patterning method may be employed to provide the large-size metal WGP.

Provided are a patterning method using an imprint mold, an imprinted pattern structure fabricated by the method, and an imprinting system.

Additional aspects will be set forth in part in the description which follows and, in part, will be apparent from the description, or may be learned by practice of the invention.

According to an aspect of the present invention, a patterning method using an imprint mold, for forming an imprinted pattern structure, includes providing a resist layer from which the imprinted pattern structure is formed, performing a first imprint process on a first area of the resist layer by using the imprint mold to form a first pattern of the pattern structure through deformation of the resist layer in the first area, and performing a second imprint process on a second area of the resist layer by using the imprint mold to form a second pattern of the pattern structure through deformation of the resist layer in the second area. The first and second areas are partially overlapped with each other in a third area of the resist layer, and the performing the second imprint process deforms a first portion of the first pattern in the third area to form the second pattern.

The performing the second imprint process may deform a second portion of the first pattern adjacent to the third area to form a third pattern of the pattern structure, different from the first and second patterns.

The first and second patterns may have a same width and a same pitch, and the third pattern may have a width less than a pitch of the first and second patterns.

The resist layer may include thermoplastic polymer.

The first imprint process may include heating the first area to a predetermined temperature, contacting and pressing the imprint mold to the resist layer in the first area, and detaching the imprint mold from the resist layer in the first area. The performing the second imprint process may include heating the second area to the predetermined temperature, contacting and pressing the imprint mold to the resist layer in the second area, and detaching the imprint mold from the resist layer in the second area.

The first or second area may be heated to a glass transition temperature or higher.

In the performing the second imprint process, the first portion of the first pattern in the third area may be re-deformed due to heat and pressure to form the second pattern.

The heating the first and second areas may include a heat source which is on the imprint mold or the resist layer, heating the first and second areas of the resist layer.

The patterning method may further include providing a heat sink in an area of the resist layer other than the area in which the first or second imprint process is performed, while the first or second imprint process is performed.

The imprint mold may have a flat panel shape and a mold pattern may be defined on a surface of the imprint mold.

The performing the first or second imprint process may respectively include locating the imprint mold above the first or second area of the resist layer, heating the first or second area to the predetermined temperature, contacting and pressing the imprint mold to the resist layer in the first or second area, to form the first or second pattern, and detaching the imprint mold from the first or second pattern.

The imprint mold may have a roller shape and a mold pattern may be defined on an outer circumferential surface of the roller shape imprint mold.

The performing the first or second imprint process may respectively include locating the roller shape imprint mold above the first or second area of the resist layer, heating the first or second area to the predetermined temperature, contacting and pressing the roller shape imprint mold to the resist layer in the first or second area, and moving the roller shape imprint mold in one direction while contacting and pressing the roller shape imprint mold to the resist layer and rotating the roller shape imprint mold, to form the first or second pattern.

The imprint mold may include a support plate having a flat panel shape, and a soft stamp attached on the support plate, including a material softer than a material of the support plate, and including a mold pattern defined on a surface thereof.

The performing of the first or second imprint process may respectively include locating the imprint mold above the first or second area of the resist layer, heating the first or second area to the predetermined temperature, via the support plate, contacting and pressing the imprint mold to the resist layer in the first or second area, to form the first or second pattern, separating the support plate from the soft stamp to maintain the soft stamp in contact with the first or second pattern, and detaching the soft stamp from the first or second pattern.

The providing the resist layer may include forming the resist layer on a substrate. The resist layer may include a material having viscosity which varies according to an external environmental factor other than heat. The external environmental factor may include ultraviolet ("UV"), power of hydrogen (pH), or a wavelength of light.

According to another aspect of the present invention, an imprinted pattern structure includes an imprinted first pattern having a repetitive shape, an imprinted second pattern adjacent to the first pattern and having a repetitive shape, and an imprinted third pattern between the first and second patterns and having a width less than a pitch of the first and second patterns.

Each of the first, second and third patterns may include thermoplastic polymer. The first and second patterns may have the same shape. The first and second patterns may have a stripe shape. Each of the first and second patterns may have a nano-scale pitch.

The pattern structure, in a plan view, may have a rectilinear shape of which a diagonal dimension thereof is about 12 inches or more.

According to another aspect of the present invention, an imprinting system for forming an imprinted pattern structure includes an imprint mold including a mold pattern, a resist layer including thermoplastic polymer and having a predetermined area in which a pattern of the imprinted pattern structure is formed by an imprint process using the imprint mold, and a heat source configured to heat the resist layer.

Since a plurality of imprint processes are performed on a single resist layer that is formed of thermoplastic polymer, a large-size patterning process may be embodied. An area on which a pre-imprint process is performed and an area on which a post-imprint process is performed are partially overlapped with each other. Thermoplastic polymer forming the resist layer is re-deformed in the overlapping area, thereby forming a pattern. Accordingly, a pattern structure that has minimum or effectively no defects and has uniform physical characteristics over the whole planar area may be fabricated to have a large size by using a single, same mask or mold.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
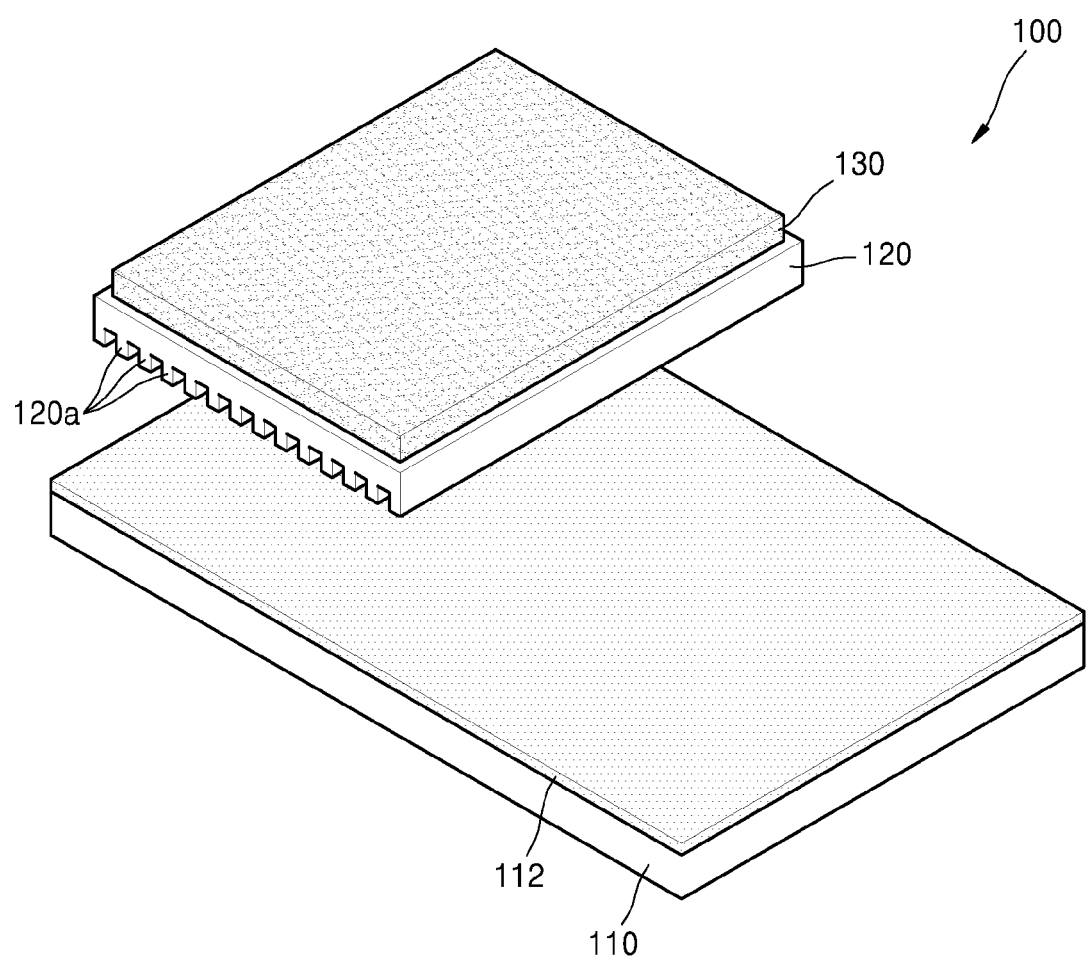
FIG. 1 is a perspective view illustrating an imprinting system according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

In the following description, when a layer is described to exist on another layer, the layer may exist directly on the other layer or a third layer may be interposed therebetween. Also, the thickness or size of each layer illustrated in the drawings may be exaggerated for convenience of explanation and clarity. The material forming each layer in the following embodiments is exemplary and thus other material may be used therefor. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the technical principle and does not pose a limitation on the scope of the invention unless otherwise claimed. No language in the specification should be construed as indicating any non-claimed element as essential to the practice of the disposed embodiment as used herein.

Hereinafter, the invention will be described in detail with reference to the accompanying drawings.

FIG. 1 is a perspective view illustrating an imprinting system 100 according to an embodiment.

Referring to FIG. 1, the imprinting system 100 includes a resist layer 112, an imprint mold 120 for forming a predetermined pattern in and/or on the resist layer 112, and a heat source 130 for heating the resist layer 112. The resist layer 112 may be disposed on a substrate 110. As the substrate 110, for example, a glass substrate, a silicon substrate, or a plastic film may be used. However, the present invention is not limited thereto, and thus other materials may be used for the substrate 110.

The resist layer 112 may include thermoplastic polymer. The thermoplastic polymer is plastically deformable when heated at a temperature higher than a predetermined temperature. In an embodiment, for example, when the thermoplastic polymer is heated to a glass transition temperature or higher, the thermoplastic polymer changes from a solid state to a soft state. In this soft state, as pressure is applied to the thermoplastic polymer in the soft state, plastic deformation may occur. The thermoplastic polymer may include, for example, polystyrene ("PS") or poly(methylmethacrylate) ("PMMA"). However, the present invention is not limited thereto, and thus other various materials may be used as the thermoplastic material with which the resist layer 112 is formed. The resist layer 112 may be formed in a relatively large size. In an embodiment, for example, the size of a (maximum) diagonal dimension of a substantially rectilinear resist layer 112 may be about 12 inches or more. However, the present invention is not limited thereto, and thus the size of the resist layer 112 may be variously changed.

The imprint mold 120 is provided above the resist layer 112. The imprint mold 120 has a flat panel shape and a mold pattern 120a is disposed on a lower surface of the imprint mold 120. The imprint mold 120 may include, for example, silicon, stainless steel ("SUS"), or quartz. However, the present invention is not limited thereto, and thus the imprint mold 120 may include other various materials. The mold pattern 120a may be, for example, an uneven pattern having a repetitive shape in the form of stripes. However, the present invention is not limited thereto, and thus the mold pattern 120a may have a different shape. The imprint mold 120 may be a single, unitary, indivisible member and may include a single material. However, the present invention is not limited thereto.

The heat source 130 is provided on an upper surface of the imprint mold 120. The heat source 130 heats the imprint mold 120 and the heated imprint mold 120 heats the resist layer 112 to a predetermined temperature, for example, the glass transition temperature or higher, via the imprint mold 120. Alternatively, the heat source 130 may be provided at the substrate 110, rather than at the imprint mold 120, as described below.

Referring to the above-described imprinting system 100, a pattern structure 150 (refer to FIG. 8) may be fabricated to have a relatively large size. In an embodiment of a large-size pattern structure patterning method, the method includes preparing the resist layer 112 for forming a pattern, forming a first pattern 112a (refer to FIG. 8) through deformation of the resist layer 112 by performing a first imprint process on a first area A1 (refer to FIG. 2A) of the resist layer 112 by using the imprint mold 120, and forming a second pattern 112b (refer to FIG. 8) through deformation of the resist layer 112 by performing a second imprint process on a second area A2 (refer to FIG. 5A) of the resist layer 112 by using the imprint mold 120.

Figure 5A:
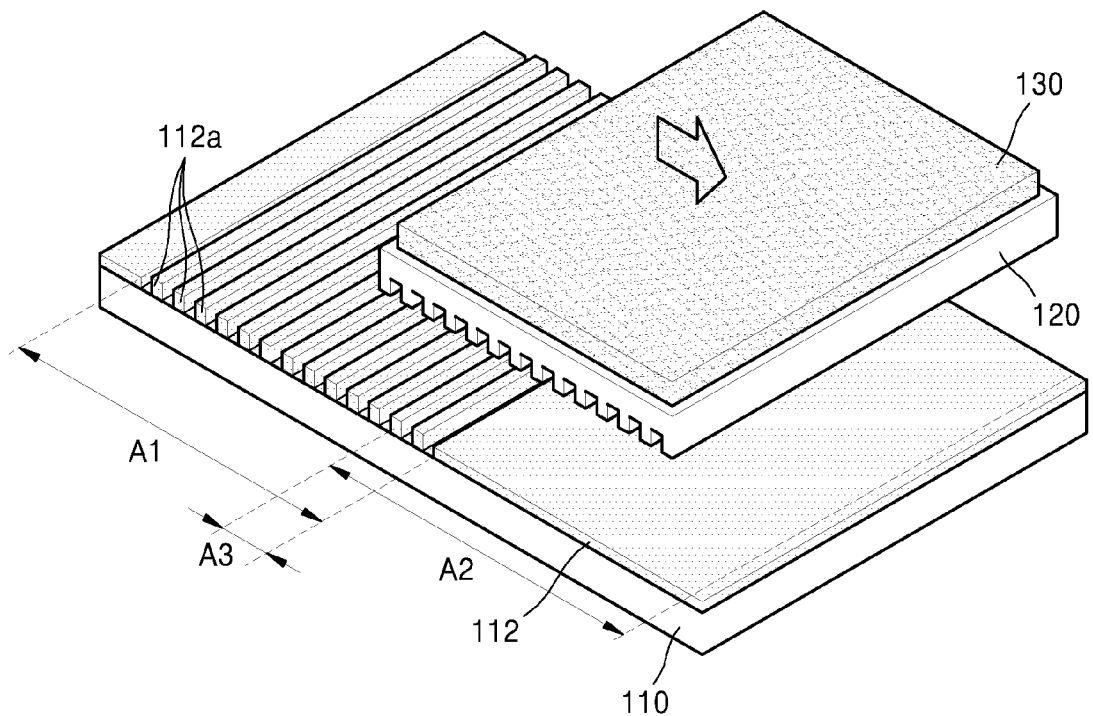

Referring to FIG. 5A, the first area A1 and the second area A2 partially overlap each other. The first pattern 112a in an overlapping area A3 of FIG. 5A is deformed in the second imprint. A portion of the first pattern 112a adjacent to and/or within the overlapping area A3 is deformed to form a third pattern 112c. The third pattern 112c is formed between the first pattern 112a and the second pattern 112b and a pattern width of the third pattern 112c is smaller than a pattern pitch of the first and second patterns 112a and 112b. Accordingly, the pattern structure 150 having minimum or effectively no defects and having a relatively large size may be fabricated by using the above large-size pattern structure patterning method. In the following description, the method of patterning a pattern structure having a large size may be described in more detail.

FIGS. 2A to 7B illustrate a patterning method using the imprinting system 100 of FIG. 1. In detail, FIGS. 2A to 4B illustrate the first imprint process and FIGS. 5A to 7B illustrate the second imprint process.

Figure 2A:
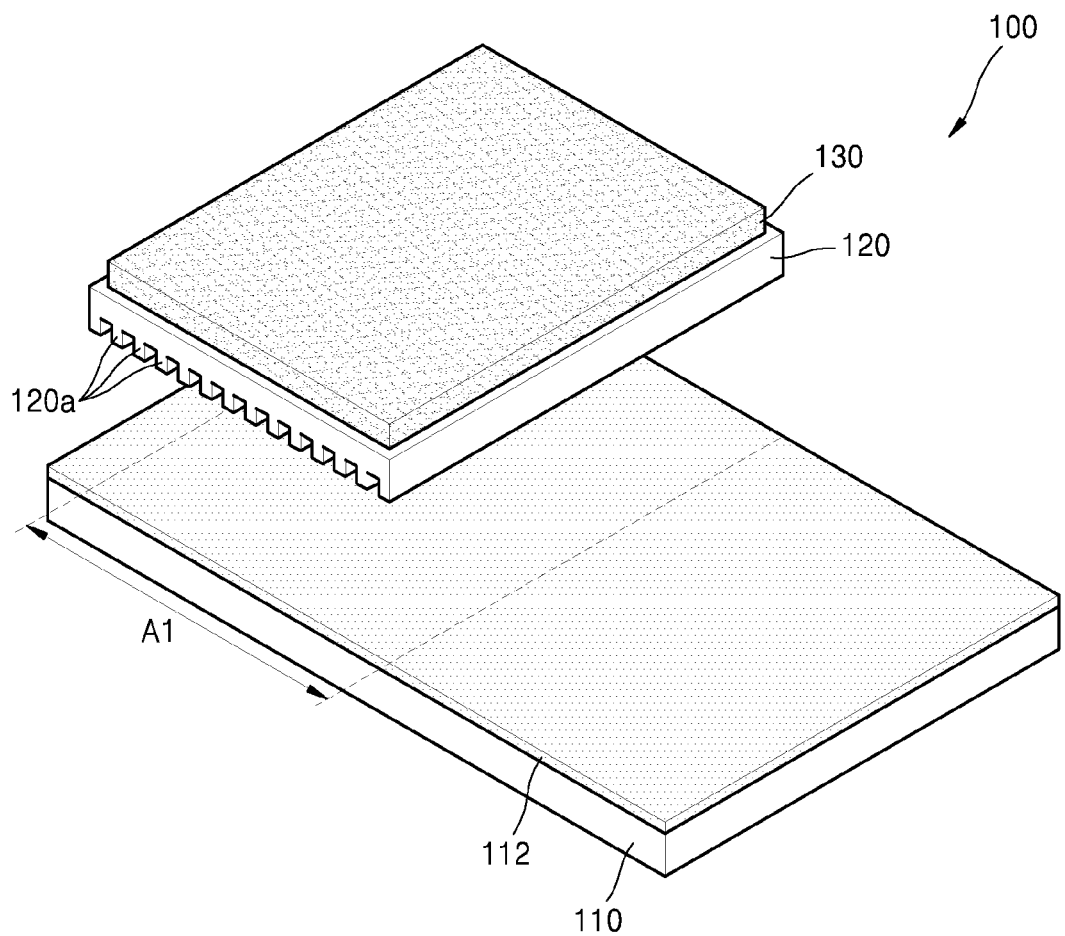
FIGS. 2A to 7B illustrate a patterning method using the imprinting system of FIG. 1.
Figure 2B:
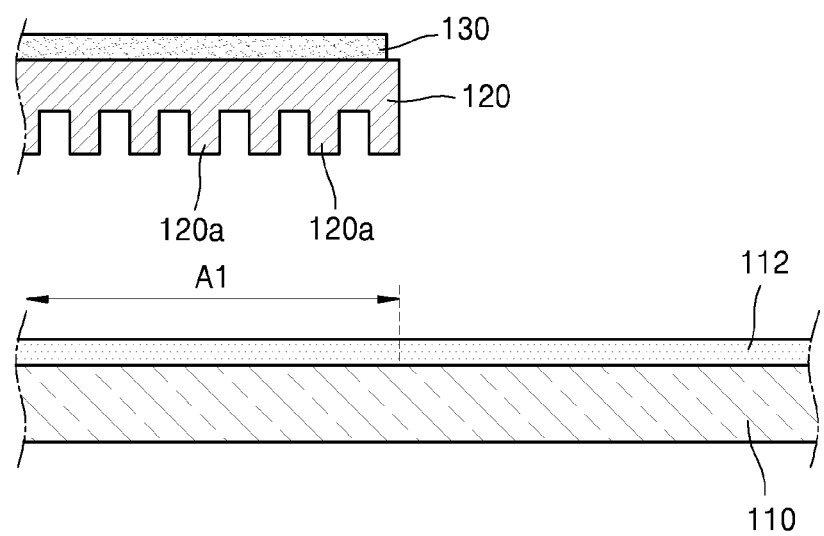

FIG. 2A is a perspective view illustrating a state in which the imprint mold 120 is located above the first area A1 of the resist layer 112. FIG. 2B is a cross-sectional view illustrating a part of the imprinting system 100 in the state of FIG. 2A. Referring to FIGS. 2A and 2B, the imprint mold 120 with the heat source 130 attached thereon is located above the first area A1 of the resist layer 112.

Figure 3A:
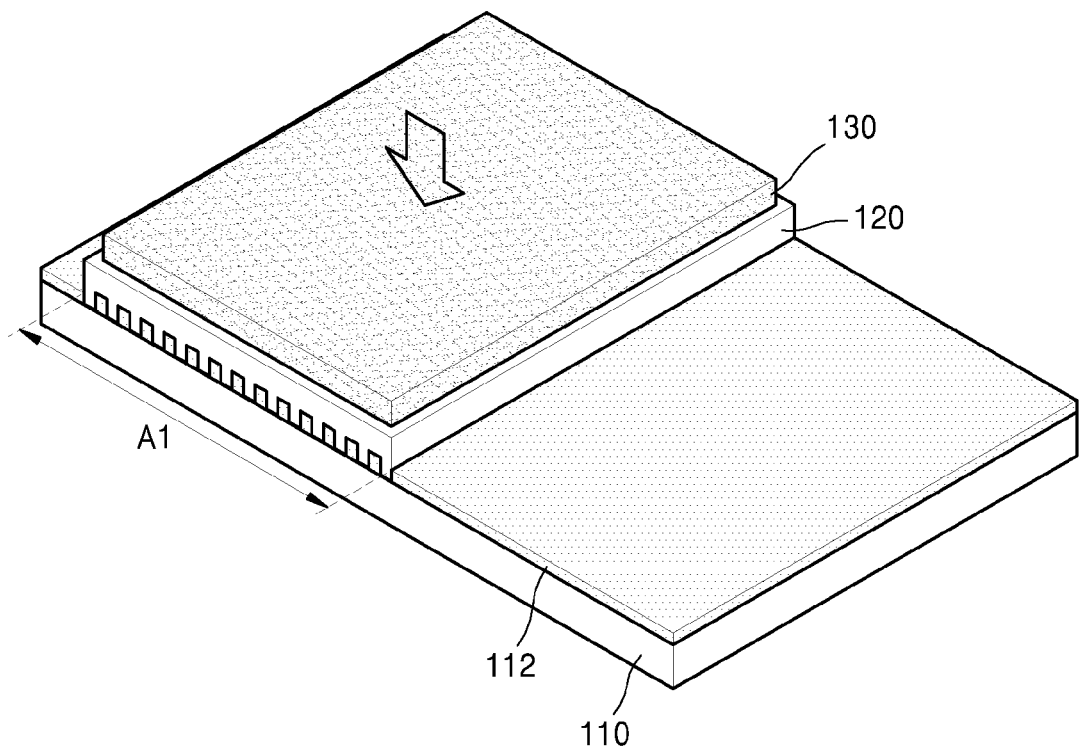
Figure 3B:
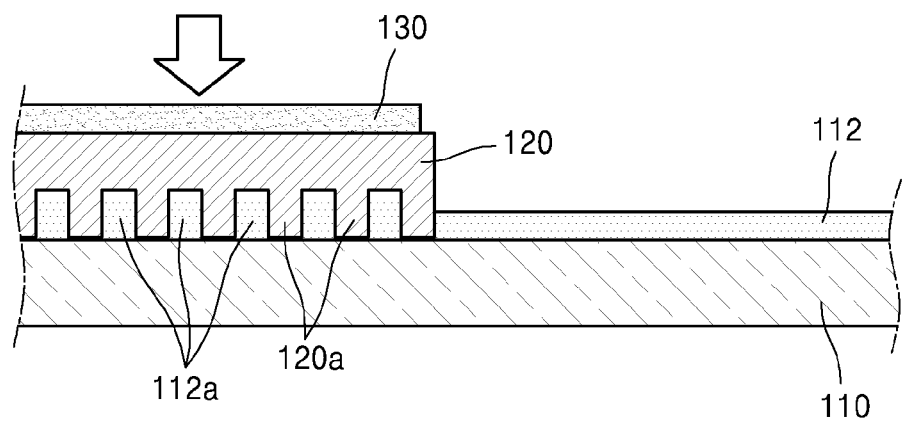

FIG. 3A is a perspective view illustrating a state in which the imprint mold 120 is lowered (indicated by the downward arrow) so as to closely contact the first area A1 of the resist layer 112. FIG. 3B is a cross-sectional view illustrating a part of the imprinting system 100 in the state of FIG. 3A. Referring to FIGS. 3A and 3B, the imprint mold 120 is heated by the heat source 130 and, as the heated imprint mold 120 contacts and presses the first area A1 of the resist layer 112, the first pattern 112a is formed. In detail, first, the imprint mold 120 is heated and then is placed in contact with the first area A1 of the resist layer 112. Accordingly, the first area A1 is heated to a predetermined temperature through the imprint mold 120 that is heated by the heat source 130. Alternatively, the imprint mold 120 may be first placed in contact with the first area A1 of the resist layer 112 and then heated. The first area A1 of the resist layer 112 may be heated to the glass transition temperature or higher. In an embodiment, for example, when the resist layer 112 includes PS or PMMA, the first area A1 of the resist layer 112 may be heated from about 100 degrees Celsius (° C.) to about 120° C. However, the present invention is not limited thereto and the heating temperature of the resist layer 112 may be variously changed.

As such, when the first area A1 of the resist layer 112 that includes thermoplastic polymer is heated to a predetermined temperature, the first area A1 is changed from a solid state to a soft state. When the imprint mold 120 contacts and is pressed into the first area A1 of the resist layer 112 in the soft state, the thermoplastic polymer in the first area A1 is deformed due to the flow of the thermoplastic polymer material being in the soft state. Accordingly, the first pattern 112a is formed in the first area A1 of the resist layer 112. The first pattern 112a may be formed in a shape corresponding to the mold pattern 120a of the imprint mold 120. In an embodiment, for example, the first pattern 112a may have a repetitive shape having a predetermined pitch P of FIG. 8, like a stripe shape. As the stripe shape, the pattern may be elongated in a length direction and relatively narrow in a width direction. The pitch P is taken in the width direction of the stripe shape pattern.

Figure 4A:
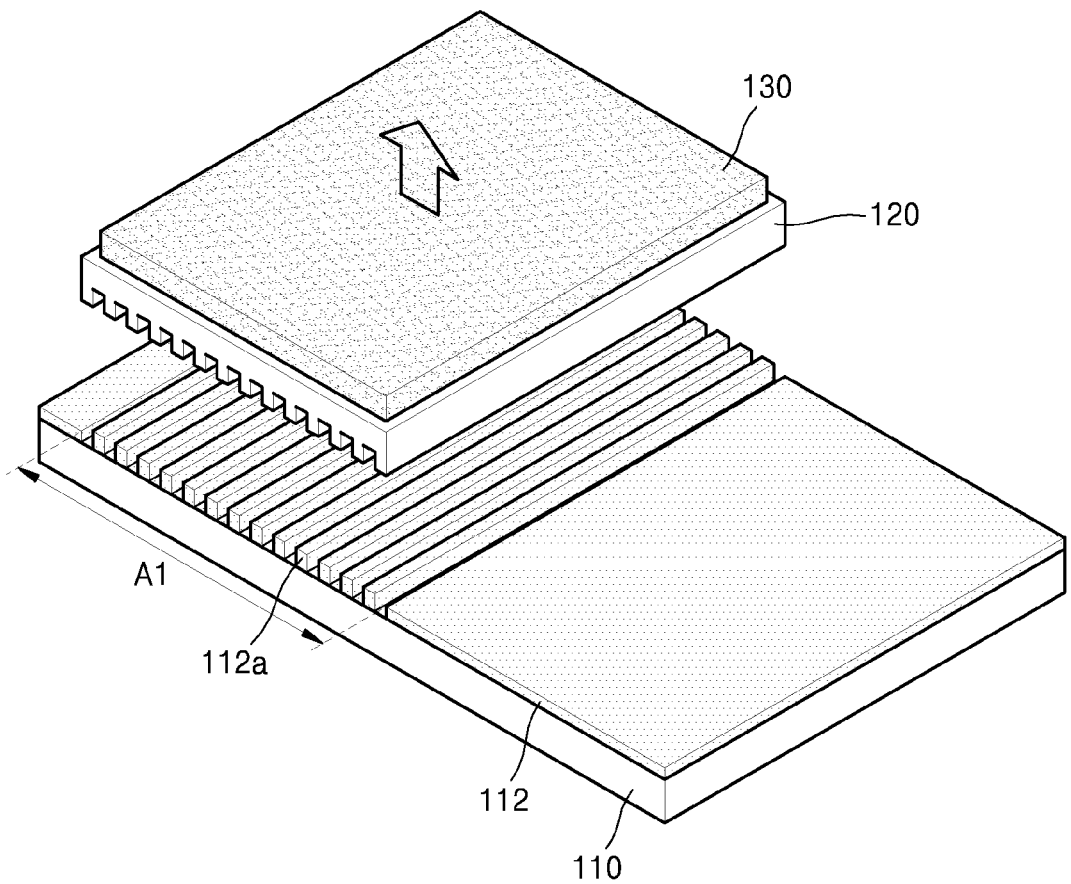
Figure 4B:
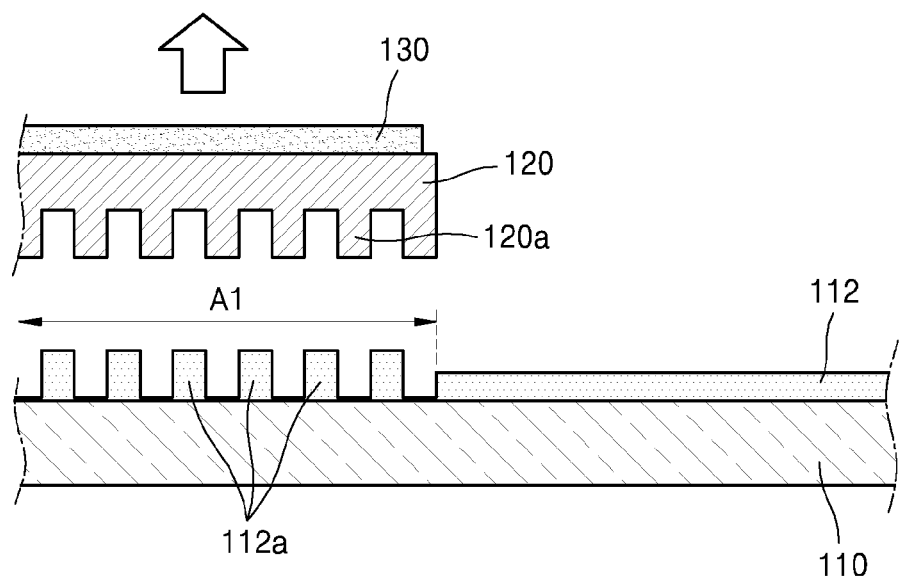

FIG. 4A is a perspective view illustrating a state in which the imprint mold 120 is detached from the first area A1 of the resist layer 112 where the first pattern 112a is formed. FIG. 4B is a cross-sectional view illustrating a part of the imprinting system 100 in the state of FIG. 4A. Referring to FIGS. 4A and 4B, after the first pattern 112a is formed in the first area A1 of the resist layer 112, the imprint mold 120 is detached from the first area A1 where the first pattern 112a is formed.

Figure 5B:
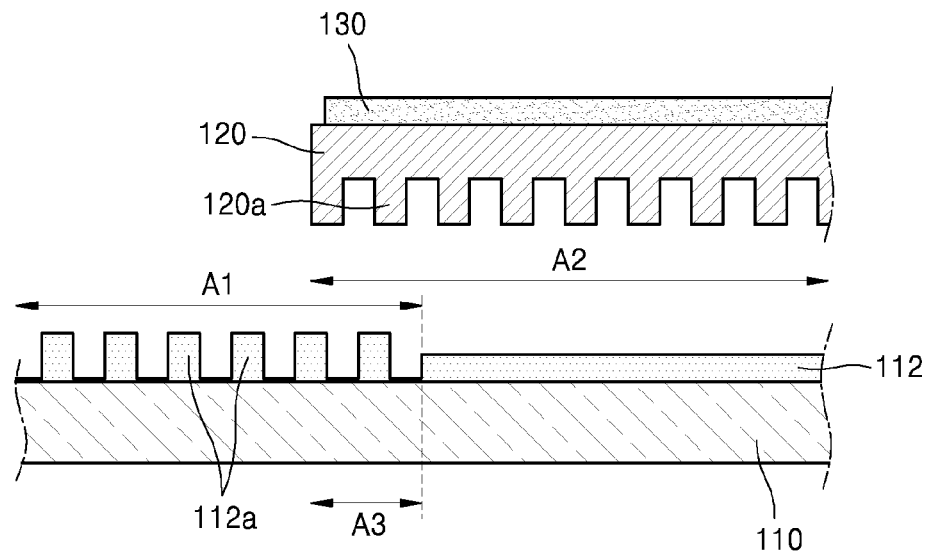

FIG. 5A is a perspective view illustrating a state in which the imprint mold 120 is located above the second area A2 of the resist layer 112. FIG. 5B is a cross-sectional view illustrating a part of the imprinting system 100 in the state of FIG. 5A. Referring to FIGS. 5A and 5B, the imprint mold 120 that is detached from the first area A1 is moved to be located above the second area A2 of the resist layer 112. The first area A1 and the second area A2 are partially overlapped with each other. A portion of the second area A2 that overlaps the first area A1 and is in the overlapping area A3, initially includes the previously formed first pattern 112a. A remaining portion of the second area A2 that does not overlap the first area A1 includes the resist layer 112.

Figure 6A:
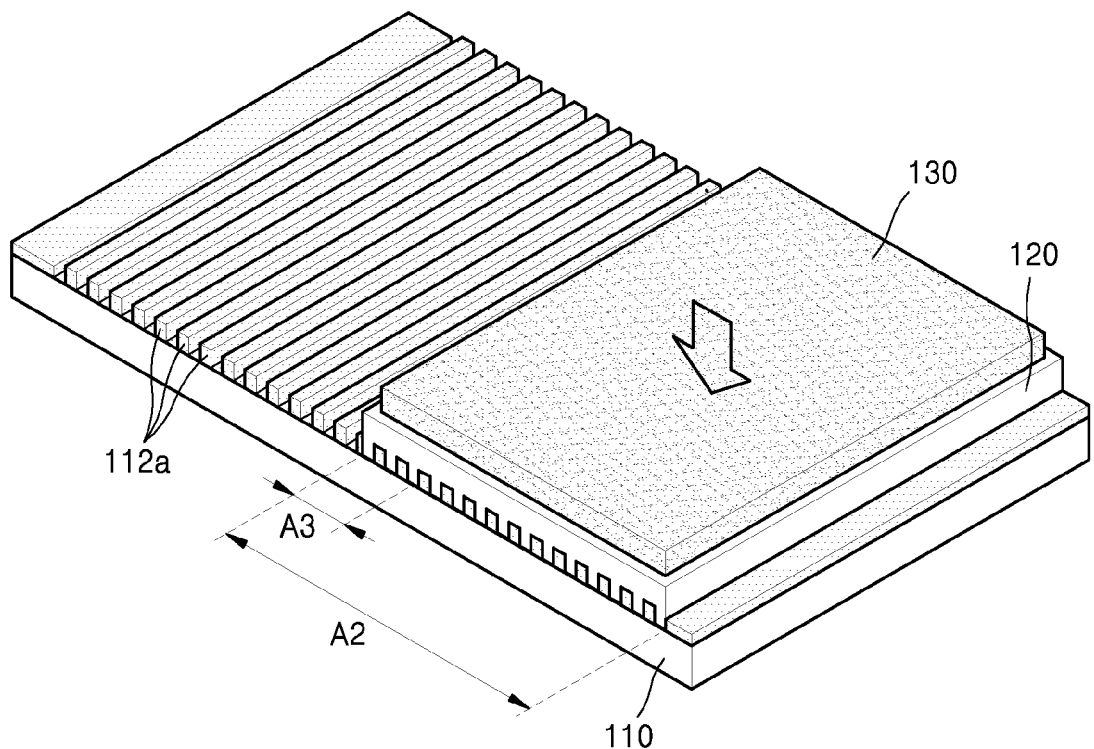
Figure 6B:
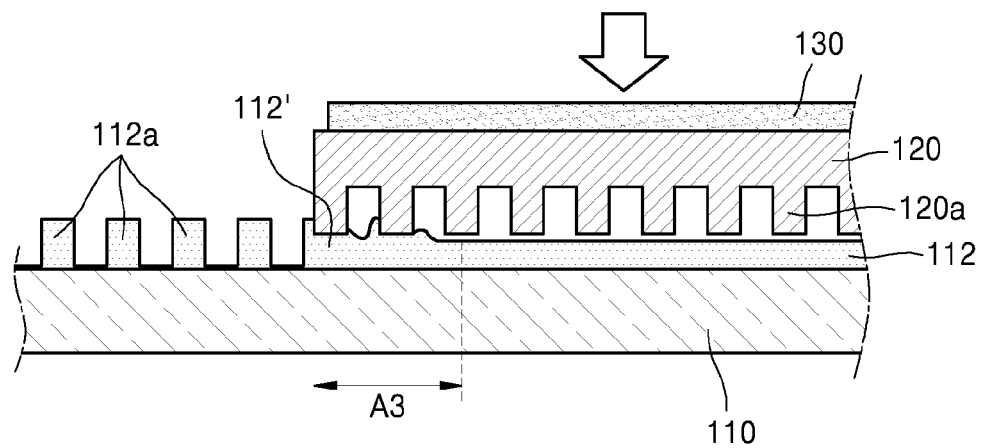
Figure 6C:
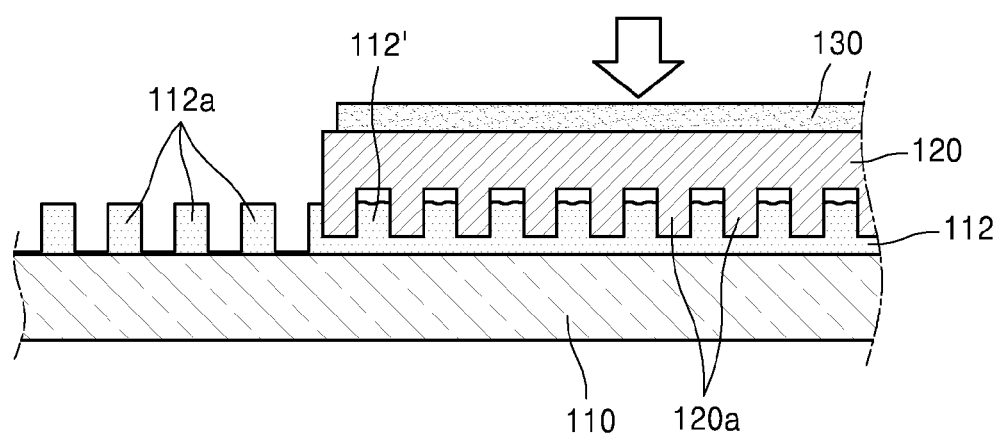
Figure 6D:
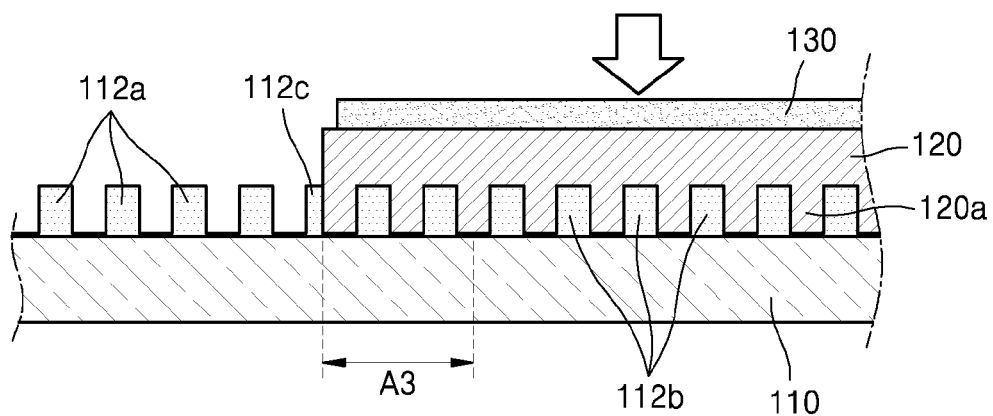

FIG. 6A is a perspective view illustrating a state in which the imprint mold 120 is lowered to closely contact and press the second areas A2 of the resist layer 112. FIGS. 6B to 6D are cross-sectional views illustrating in detail a process in which the imprint mold 120 closely contacts and is pressed to the second area A2. Referring to FIGS. 6A to 6D, the imprint mold 120 closely contacts and presses the second area A2 of the resist layer 112, thereby forming the second pattern 112b. This process is described in detail with reference to FIGS. 6B to 6D.

Referring first to FIG. 6B, the imprint mold 120 is heated and then lowered to contact the portion of the previously formed first pattern 112a of the second area A2 that is overlapped with the first area A1 and in the overlapping area A3. Then, thermoplastic resin forming the first pattern 112a and the remaining resist layer 112 is heated through the imprint mold 120 to be changed to a soft state. The thermoplastic resin may be heated at a temperature higher than, for example, the glass transition temperature. As the imprint mold 120 is lowered, a thermoplastic resin 112' in a soft state may flow due to a pressure. The thermoplastic resin 112' is the previously formed first pattern 112a in the overlapping area A3 and in the soft state.

Referring to FIG. 6C, when the imprint mold 120 is continuously lowered, the thermoplastic resin 112' in the soft state and located in the overlapping area A3 in which the second area A2 is overlapped with the first area A1, continuously flows. The portion of the remaining resist layer 112 located in the second area A2 and not overlapped with the first area A1 is changed to the soft state by the heating and thus flows due to the pressure.

Next, referring to FIG. 6D, when the imprint mold 120 is completely lowered to closely contact and press the second area A2, deformation of the thermoplastic resin 112' in the soft state located in the overlapping area A3 in which the second area A2 is overlapped with the first area A1, and portion of the remaining resist layer 112 located in the area of the second area A2 that is not overlapped with the first area A1, is completed. Accordingly, the second pattern 112b is formed in the second area A2 of the remaining resist layer 112. The second pattern 112b may have a shape corresponding to the mold pattern 120a that is formed on the imprint mold 120. Accordingly, the second pattern 112b may have the same shape as that of the first pattern 112a. In an embodiment, for example, the second pattern 112b may have a stripe shape, that is, a repetitive shape having a predetermined pitch P of FIG. 8. In the process of forming the second pattern 112b in the second area A2, the portion of the first pattern 112a that is adjacent to and/or in the overlapping area A3 in which the first area A1 and the second area A2 are overlapped with each other, may be deformed in the second imprint process, thereby forming the third pattern 112c. The third pattern 112c may have a width that is less than the pitch P of the first and second patterns 112a and 112b.

Figure 7A:
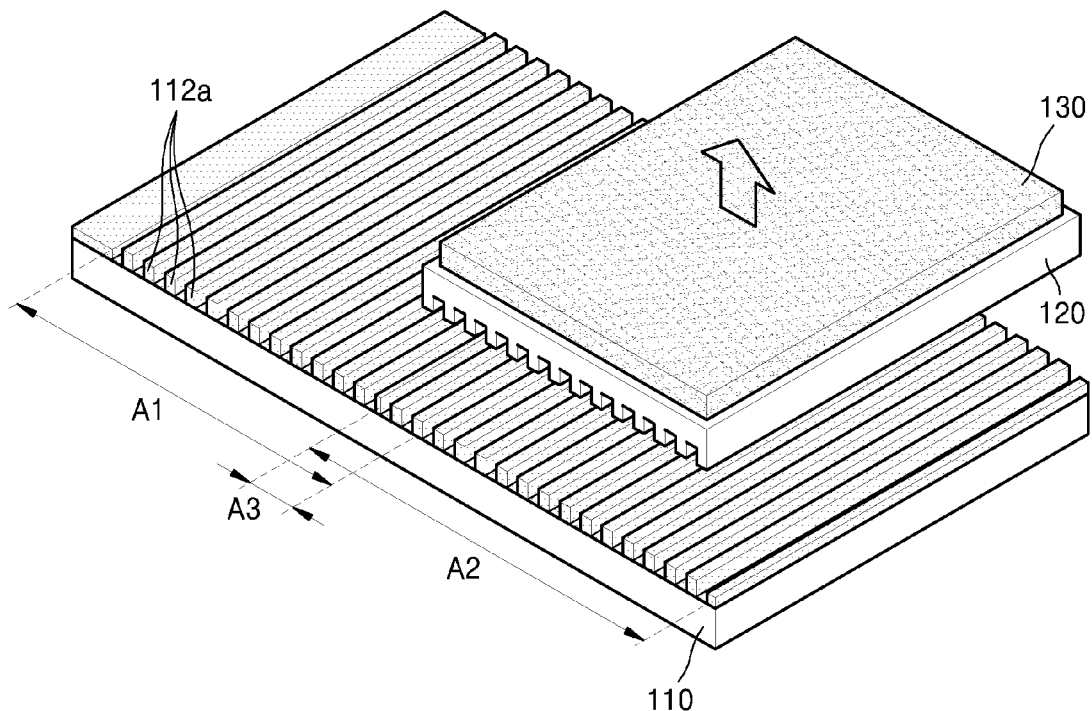
Figure 7B:
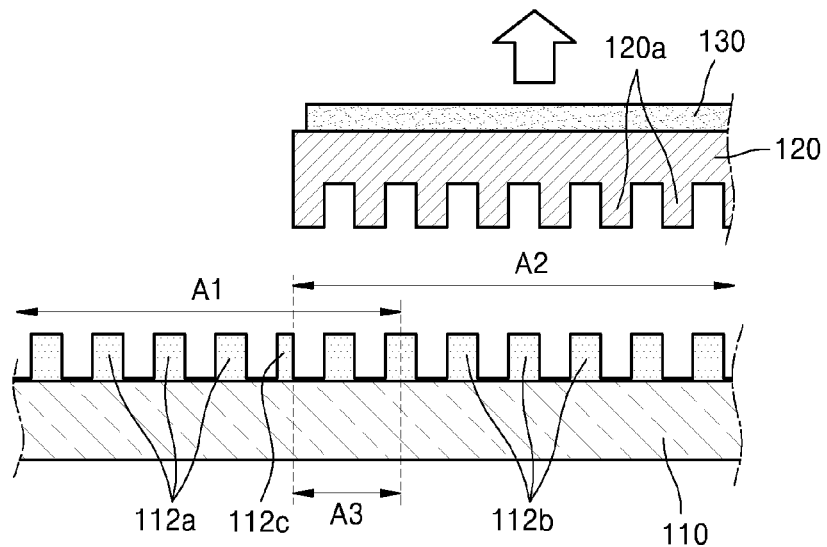

FIG. 7A is a perspective view illustrating a state in which the imprint mold 120 is detached from the second area A2 where the second pattern 112b is formed. FIG. 7B is a cross-sectional view illustrating a part of the imprinting system 100 in the state of FIG. 7A. Referring to FIGS. 7A and 7B, after the second pattern 112b is formed in the second area A2 of the resist layer 112, the imprint mold 120 is detached from the second pattern 112b and thus the patterning process is completed.

Figure 8:
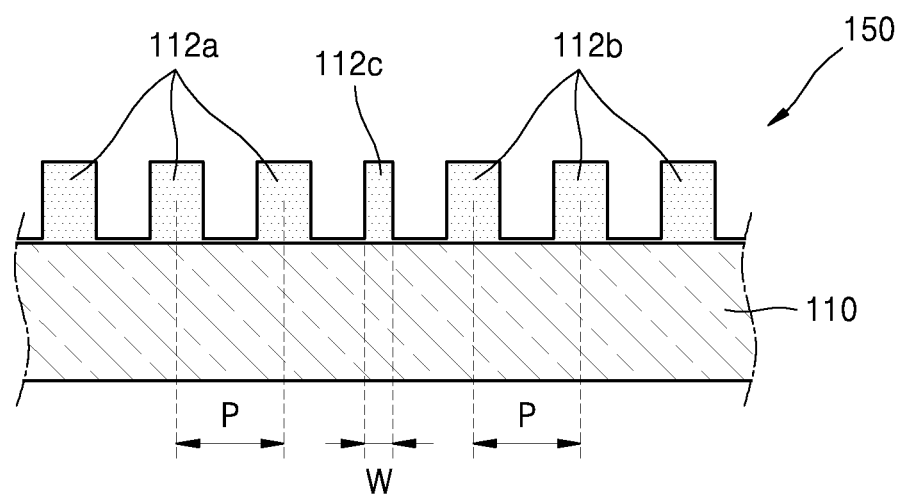
FIG. 8 illustrates a pattern structure fabricated by the patterning method illustrated in FIGS. 2A to 7B.

FIG. 8 illustrates the pattern structure 150 fabricated by the patterning method illustrated in FIGS. 2A to 7B.

Referring to FIG. 8, the first and second patterns 112a and 112b are formed on the substrate 110 to be adjacent to each other. The first and second patterns 112a and 112b may have the same pattern shape. In an embodiment, for example, the first and second patterns 112a and 112b may have a repetitive shape having a predetermined pitch P, like a stripe shape. The third pattern 112c is formed between the first pattern 112a and the second pattern 112b, along the movement direction of the imprint mold 120 and the width direction of the first to third patterns 112a to 112c.

The third pattern 112c, as described above, is formed due to a portion of the previously formed first pattern 112a that is adjacent to and/or in the overlapping area A3, where the first area A1 and the second area A2 are overlapped with each other, being re-deformed during the second imprint process. The third pattern 112c may have a width W that is smaller than the pitch P of the first and second patterns 112a and 112b. The first and second patterns 112a and 112b may have a nano-scale pitch, but the present invention is not limited thereto. As such, when the third pattern 112c is formed to have the width W that is smaller than the pitch P of the first and second patterns 112a and 112b, the pattern structure 150 having uniform physical characteristics may be fabricated over the whole area. In a (top) plan view, the pattern structure 150 may have a rectilinear shape, of which a linear diagonal dimension thereof, for example, is about 12 inches or more, but the present invention is not limited thereto.

In the above description, only two imprint processes are performed to fabricate a pattern structure. However, a pattern structure having a relatively large size may be fabricated by performing three or more imprint processes. Where the relatively large size is fabricated by performing three or more imprint processes, an area where an N-th imprint process, where N is a natural number, that is, a pre-imprint process, is performed and an area where an (N+1)th imprint process, where N is a natural number, that is, a post-imprint process, is performed are partially overlapped with each other. As the thermoplastic polymer forming the resist layer in the overlapping area is re-deformed in the (N+1)th imprint process, a pattern is formed. Accordingly, the pattern structure 150 having minimum or effectively no defects and having uniform physical characteristics over the whole planar area thereof may be fabricated to have a relatively large size.

As the size of a liquid crystal display ("LCD") panel gradually increases, the LCD panel includes a metal wire grid polarizer having a relatively large size without any defects. Accordingly, a master or mask for manufacturing a relatively large size wire grid polarizer is manufactured having the relatively large size. In conventional methods of manufacturing a relatively large side wire grid polarizer it is difficult to manufacture a mask having a large-size diagonal dimension of about 12 inches or more without a defect. However, in one or more embodiment described above, when the pattern structure 150 is fabricated by the patterning method using the imprinting system 100, a mask that has minimum or effectively no defects and has uniform physical characteristics over the whole planar area thereof may be manufactured to have a large size. The formed pattern structure 150 may be used as a large-size master used in manufacturing a metal wire grid polarizer to be applied to, for example, a large LCD panel.

Figure 9:
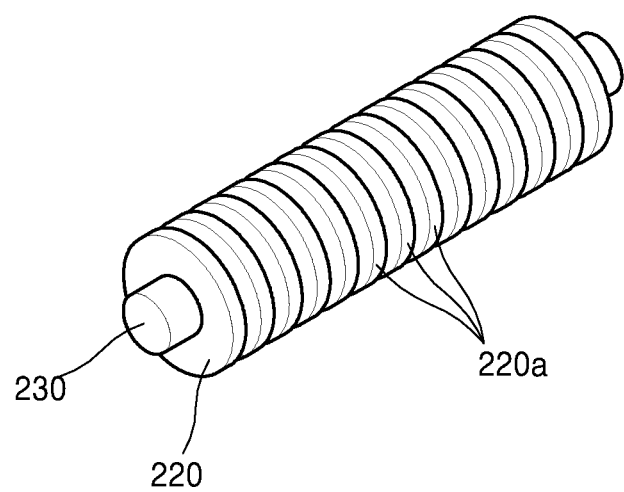
FIG. 9 illustrates another imprint mold according to an embodiment.

Although in the above description the imprint mold 120 is described as having a flat panel shape, the imprint mold 120 may have a different shape. FIG. 9 illustrates another imprint mold 220 according to an embodiment. Referring to FIG. 9, the imprint mold 220 has a roller shape and a mold pattern 220a is formed on an outer circumferential surface thereof. A heat source 230 for heating the resist layer 112 including thermoplastic resin is provided inside the imprint mold 220.

Alternatively, the heat source 230 may be provided at the substrate 110 where the resist layer 112 is formed.

Figure 10A:
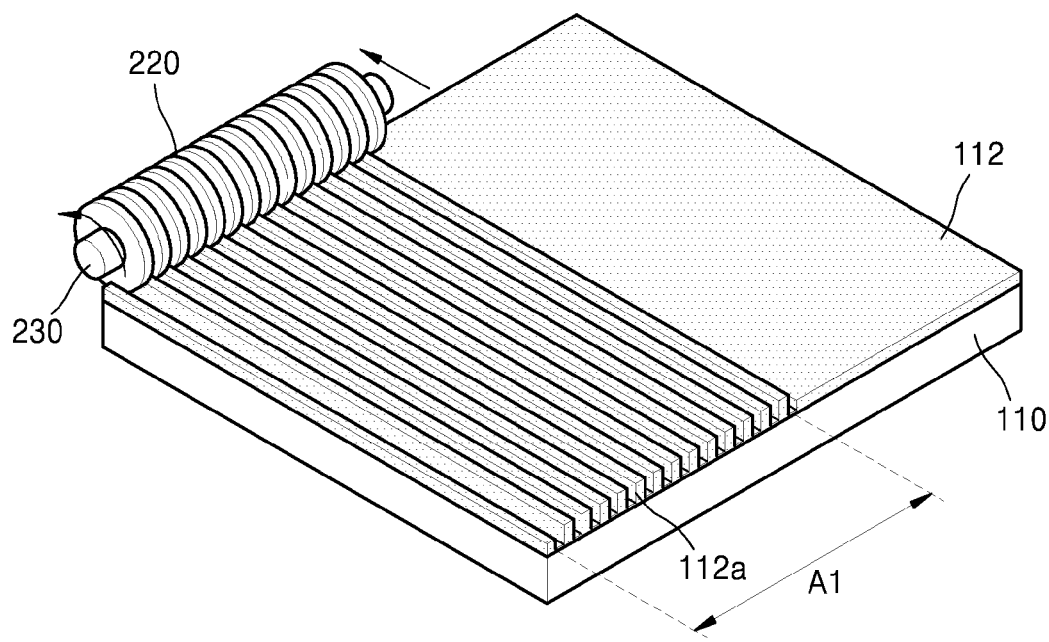
FIGS. 10A to 10C illustrates a patterning method using the imprint mold of FIG. 9.
Figure 10B:
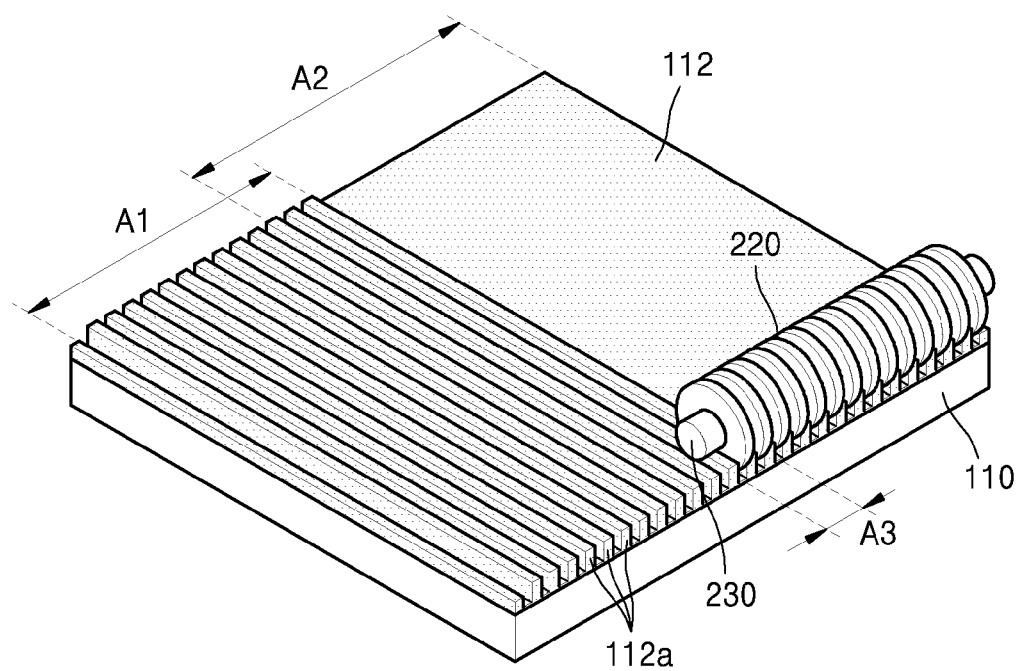
Figure 10C:
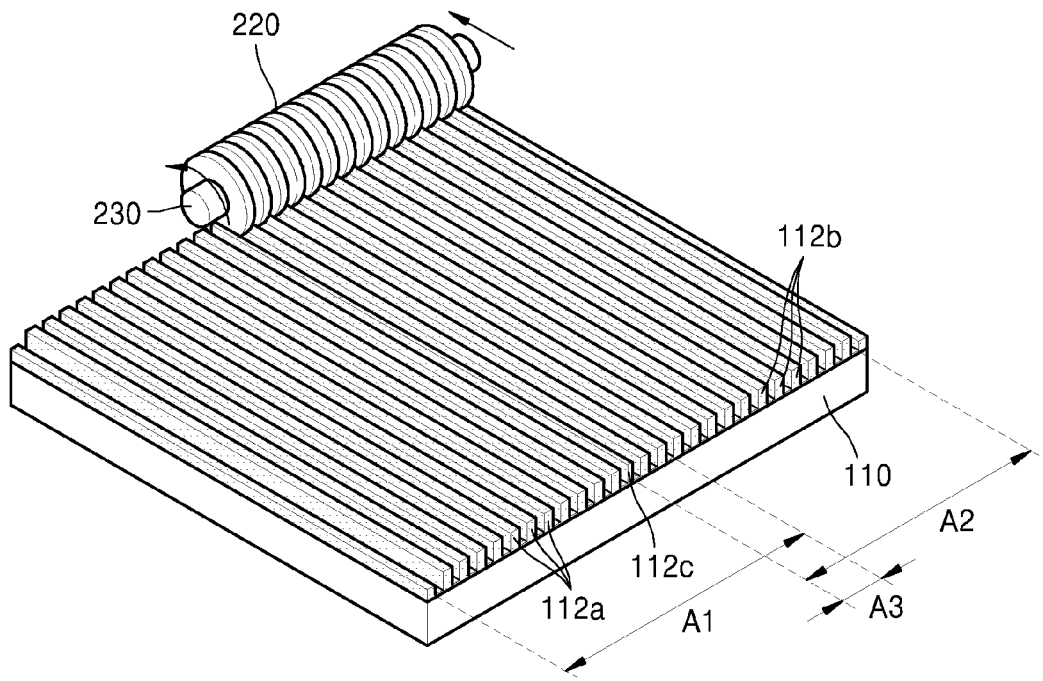

FIGS. 10A to 10C illustrate a patterning method using the imprint mold 220 of FIG. 9. The following description mainly focuses on the differences from the above-described embodiment of the patterning method using the imprint mold 120 in FIGS. 2A to 7B.

Referring to FIG. 10A, the first pattern 112a is formed on the first area A1 of the resist layer 112 by using the imprint mold 220 having a roller shape. In detail, the imprint mold 220 is located at one side of the first area A1 and then closely contacts and presses the first area A1. The imprint mold 220 is heated by the heat source 230. In this process, the resist layer 112 that is formed of thermoplastic polymer in the first area A1 is deformed due to the flow of a material. Next, when the imprint mold 220 is rotated and moved in one direction (indicated by the arrow) while remaining in contact and pressing the first area A1, the first pattern 112a may be formed in the first area A1 by the deformation of the resist layer 112. Since the first pattern 112a is already described above, a detailed description thereof is omitted here.

Referring to FIG. 10B, the imprint mold 220 is detached from the first pattern 112a and moved to be located at one side of the second area A2 of the resist layer 112. As described above, the first area A1 and the second area A2 are partially overlapped with each other. Next, the imprint mold 220 closely contacts and presses one side of the second area A2. In this process, the first pattern 112a previously formed in the overlapping area A3 in which the second area A2 overlaps the first area A1, and a portion of the remaining resist layer 112 in the second area A2 that does not overlap the first area A1, are deformed due to the flow of a material.

Referring to FIG. 10C, when the imprint mold 220 is rotated and moved in the one direction (indicated by the arrow) in a state in which the imprint mold 220 remains in contact and presses the second area A2, the second pattern 112b may be formed in the second area A2. In this process, as the portion of the previously first pattern 112a that is adjacent to and/or in the overlapping area A3 in which the first area A1 and the second area A2 are overlapped with each other is re-deformed, the third pattern 112c may be formed. Since the second and third patterns 112b and 112c are already described above, detailed descriptions thereof are omitted here.

Figure 11:
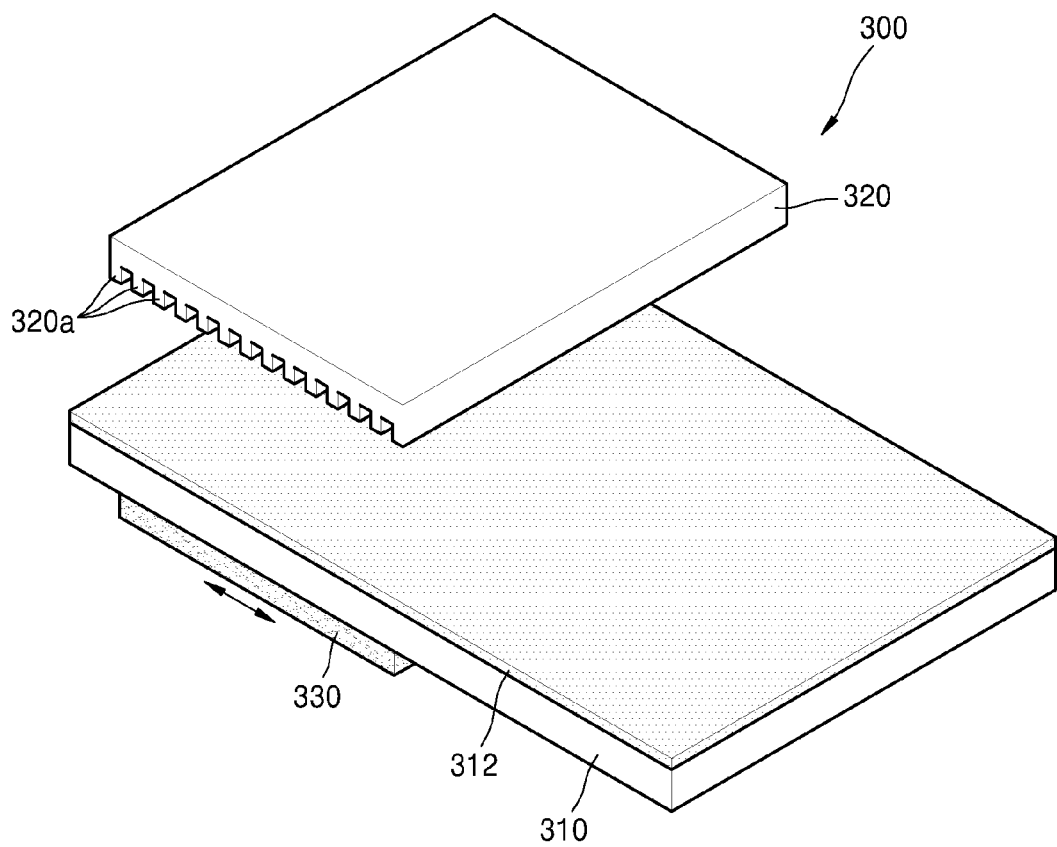
FIG. 11 is a perspective view illustrating another imprinting system according to an embodiment.

FIG. 11 is a perspective view illustrating another imprinting system 300 according to an embodiment. The following description mainly focuses on the differences from the above-described embodiments.

Referring to FIG. 11, the imprinting system 300 includes a resist layer 312, an imprint mold 320 and a heat source 330. The resist layer 312 may be formed on a substrate 310. The resist layer 312 may include thermoplastic polymer. Thermoplastic polymer may include, for example, PS or PMMA, but not limited thereto. The imprint mold 320 is provided above the resist layer 312. The imprint mold 320 may have a flat panel shape and a mold pattern 320a is formed on a lower surface of the imprint mold 320. Although not illustrated in the drawings, an imprint mold having a roller shape may be provided above the resist layer 312. In the imprint mold having a roller shape, a mold pattern is formed on an outer circumferential surface thereof.

The heat source 330 may be provided at the resist layer 312, rather than at the imprint mold 320. In detail, the heat source 330 may be movably provided on a lower surface of the substrate 310 to heat a predetermined area of the resist layer 312. The patterning method using the imprinting system 300 of FIG. 11 is substantially the same as the patterning method using the imprinting system 100 of FIG. 1, except that the heat source 330 is provided at the resist layer 312, rather than at the imprint mold 320. The patterning method using the imprinting system 300 of FIG. 11 is briefly described below.

Figure 12A:
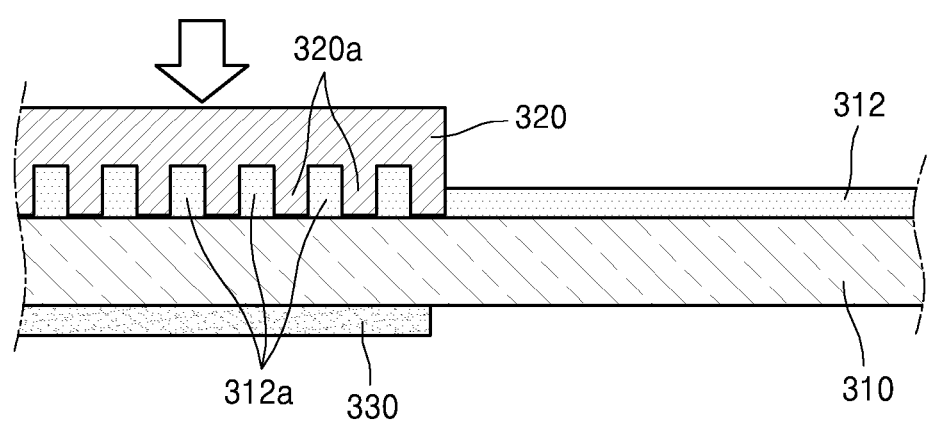
FIGS. 12A and 12B illustrate a patterning method using the imprinting system of FIG. 11.
Figure 12B:
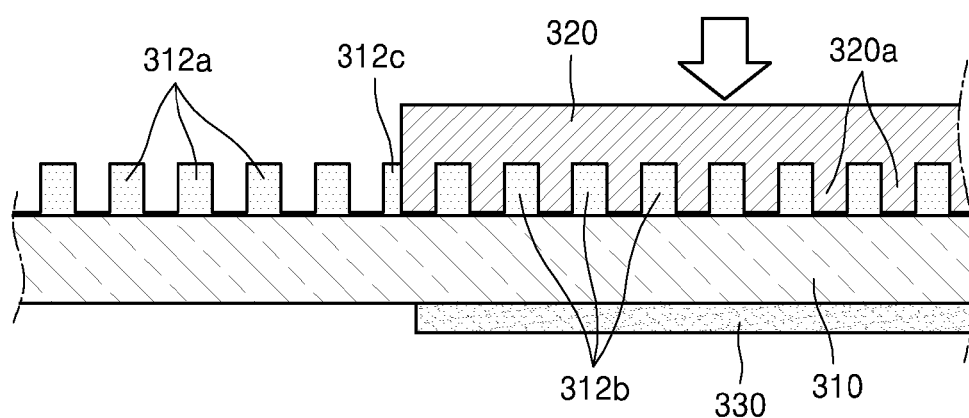

FIGS. 12A and 12B illustrate the patterning method using the imprinting system 300 of FIG. 11. Referring to FIG. 12A, after the imprint mold 320 is located above the first area A1 (refer to FIG. 2A) of the resist layer 312, the first area A1 is heated at a temperature higher than a predetermined temperature, for example, the glass transition temperature, by using the heat source 330 that is provided on the lower surface of the substrate 310. The heat source 330 may be provided at a position corresponding to the first area A1. Next, as the imprint mold 320 closely contacts and presses the first area A1, the resist layer 312 formed of thermoplastic polymer in the first area A1 is deformed due to the flow of a material. Accordingly, a first pattern 312a is formed in the first area A1. Next, the imprint mold 320 is detached from the first pattern 312a.

Referring to FIG. 12B, after the imprint mold 320 is moved to be located above the second area A2 (refer to FIG. 5A) of the resist layer 312, the second area A2 is heated at a temperature higher than a predetermined temperature, for example, the glass transition temperature, by using the heat source 330 that is provided on the lower surface of the substrate 310. The heat source 330 may be provided at a position corresponding to the second area A2. As described above, the first and second areas A1 and A2 may be partially overlapped with each other. Next, when the imprint mold 320 closely contacts and presses the second area A2, a portion of the previously formed first pattern 312a in the overlapping area A3 (refer to FIG. 5A) in which the second area A2 is overlapped with the first area A1, and a portion of the remaining resist layer 312 in the area of the second area A2 that is not overlapped with the first area A1 are deformed due to the flow of a material and thus the second pattern 312b is formed. In this process, as the portion of the previously formed first pattern 112a that is adjacent to and/or within the overlapping area A3 in which the first area A1 and the second area A2 are overlapped with each other is re-deformed, the third pattern 112c may be formed. Next, the imprint mold 320 is detached from the second pattern 312b.

Figure 13:
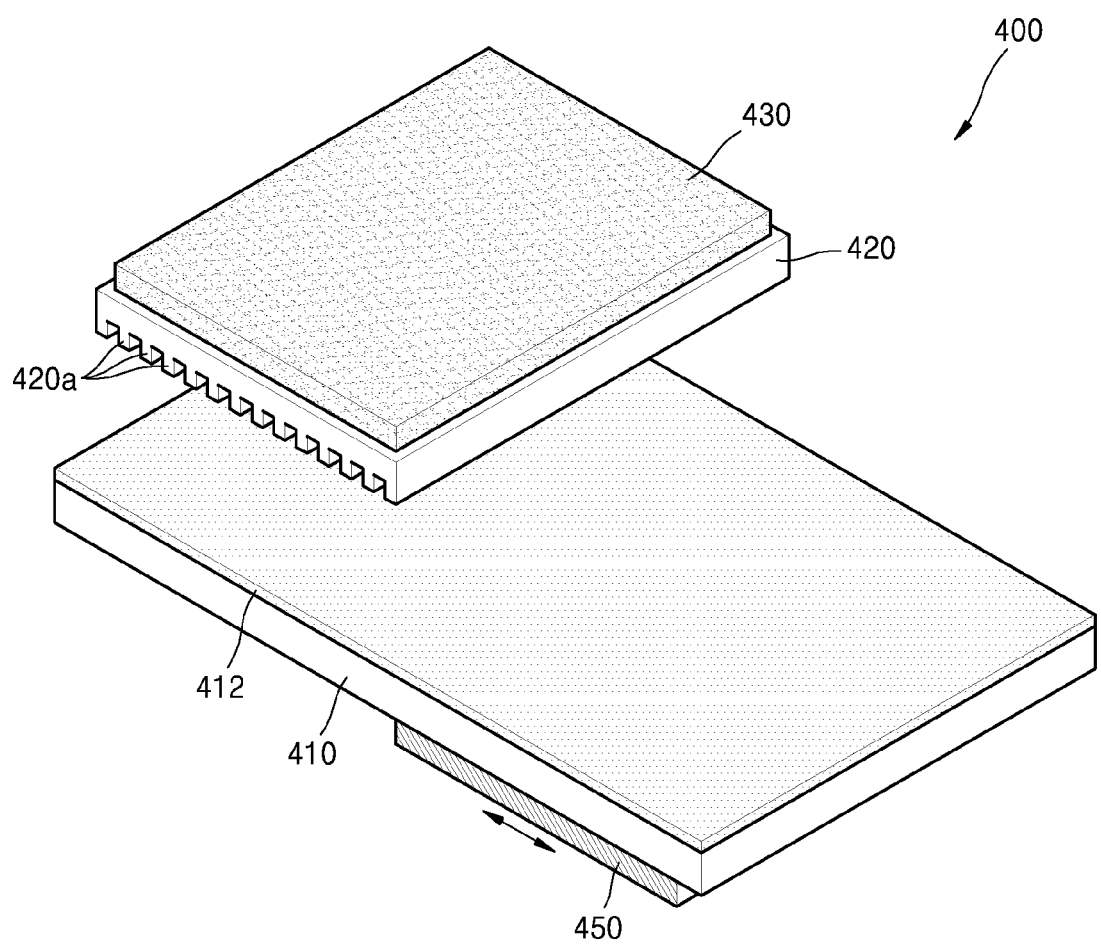
FIG. 13 is a perspective view illustrating still another imprinting system according to an embodiment.

FIG. 13 is a perspective view illustrating still another imprinting system 400 according to an embodiment. The following description mainly focuses on the differences from the above-described embodiments.

Referring to FIG. 13, the imprinting system 400 includes a resist layer 412, an imprint mold 420, a heat source 430 and a heat sink 450. The resist layer 412 may be formed on a substrate 410 and may include thermoplastic polymer. The imprint mold 420 is provided above the resist layer 412. The imprint mold 420 may have a flat panel shape and a mold pattern 420a is formed on a lower surface of the imprint mold 420. The heat source 430 for heating a predetermined area of the resist layer 412 is provided at the imprint mold 420. Although not illustrated in the drawings, an imprint mold having a roller shape may be provided above the resist layer 412. In the imprint mold having a roller shape, a mold pattern is formed on an outer circumferential surface thereof, and a heat source may be provided inside the roller shape imprint mold.

The heat sink 450 is provided at the resist layer 412. The heat sink 450 may be movably provided on a lower surface of the substrate 410. The heat sink 450 reduces or effectively prevents deformation of an area of the resist layer 412 on which the imprint process is not performed, due to thermal transfer. Since the heat transferred to the area on which the imprint process is not performed while the imprint process is performed on a predetermined area of the resist layer 412 is dissipated outside via the heat sink 450, deformation of the area on which the imprint process is not performed, due to thermal transfer, may be reduced or effectively prevented.

To this end, the heat sink 450 may include a material exhibiting superior thermal transfer characteristics. The patterning method using the imprinting system 400 of FIG. 13 is substantially the same as the patterning method using the imprinting system 100 of FIG. 1, except that the heat sink 450 is provided on the lower surface of the substrate 410. Accordingly, the patterning method using the imprinting system 400 of FIG. 13 is briefly described in the following description.

Figure 14A:
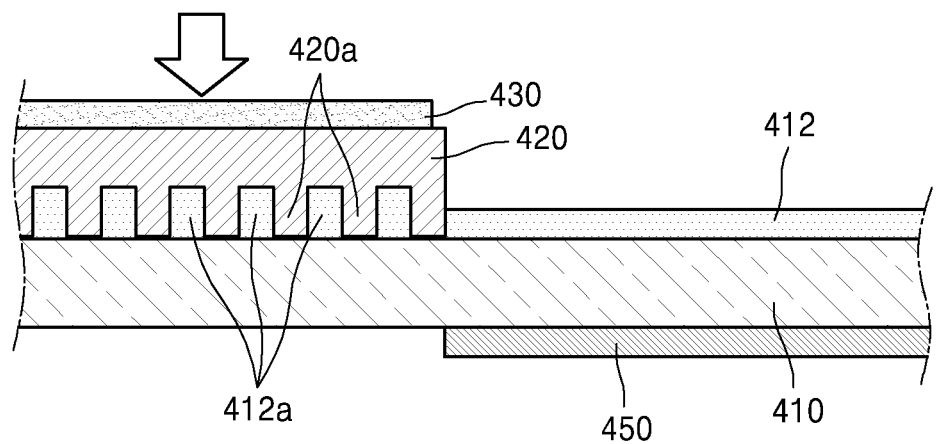
FIGS. 14A and 14B illustrate a patterning method using the imprinting system of FIG. 13.
Figure 14B:
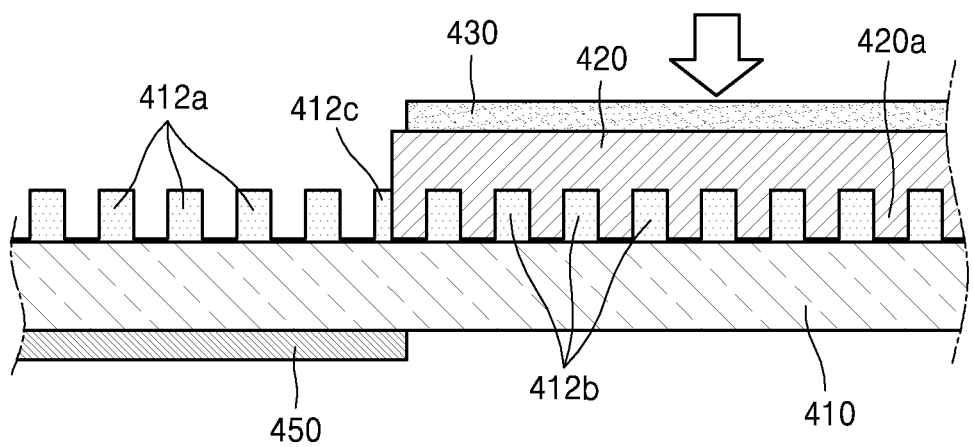

FIGS. 14A and 14B illustrate a patterning method using the imprinting system 400 of FIG. 13. Referring to FIG. 14A, the imprint mold 420 is located above the first area A1 (refer to FIG. 2A) of the resist layer 412. The heat sink 450 is provided at a position corresponding to an area other than the first area A1. Next, the imprint mold 420 is heated by using the heat source 430 and then closely contacts and is pressed to the first area A1. Then, the resist layer 412 formed of thermoplastic polymer in the first area A1 is deformed due to the flow of a material and thus the first pattern 412a is formed in the first area A1. Since the heat sink is provided at a position corresponding to an area other than the first area A1, the heat sink 450 may reduce or effectively prevent the area other than the first area A1 from being deformed due to thermal transfer. Next, the imprint mold 420 is detached from the first pattern 412a.

Referring to FIG. 14B, the imprint mold 420 is moved to be located above the second area A2 (refer to FIG. 5A) of the resist layer 412. As described above, the first and second areas A1 and A2 may partially overlap each other. The heat sink 450 is provided at a position corresponding to the area other than the second area A2. Next, after the imprint mold 420 is heated by using the heat source 430, the imprint mold 420 closely contacts and is pressed to the second area A2. Then, a portion of the previously formed first pattern 412a in the overlapping area A3 in which the second area A2 overlaps the first area A1, and a portion of the remaining resist layer 412 in the second area A2 that does not overlap the first area A1, are deformed due to the flow of a material, thereby forming the second pattern 412b. Since the heat sink is provided at a position corresponding to an area other than the second area A2, the heat sink 450 may reduce or effectively prevent the area other than the second area A2 from being deformed due to thermal transfer. In this process, as the portion of the previously formed first pattern 112a that is adjacent to and/or within the overlapping area A3 in which the first area A1 and the second area A2 are overlapped with each other is re-deformed, a third pattern 412c may be formed. Next, the imprint mold 420 is detached from the second pattern 412b.

Figure 15:
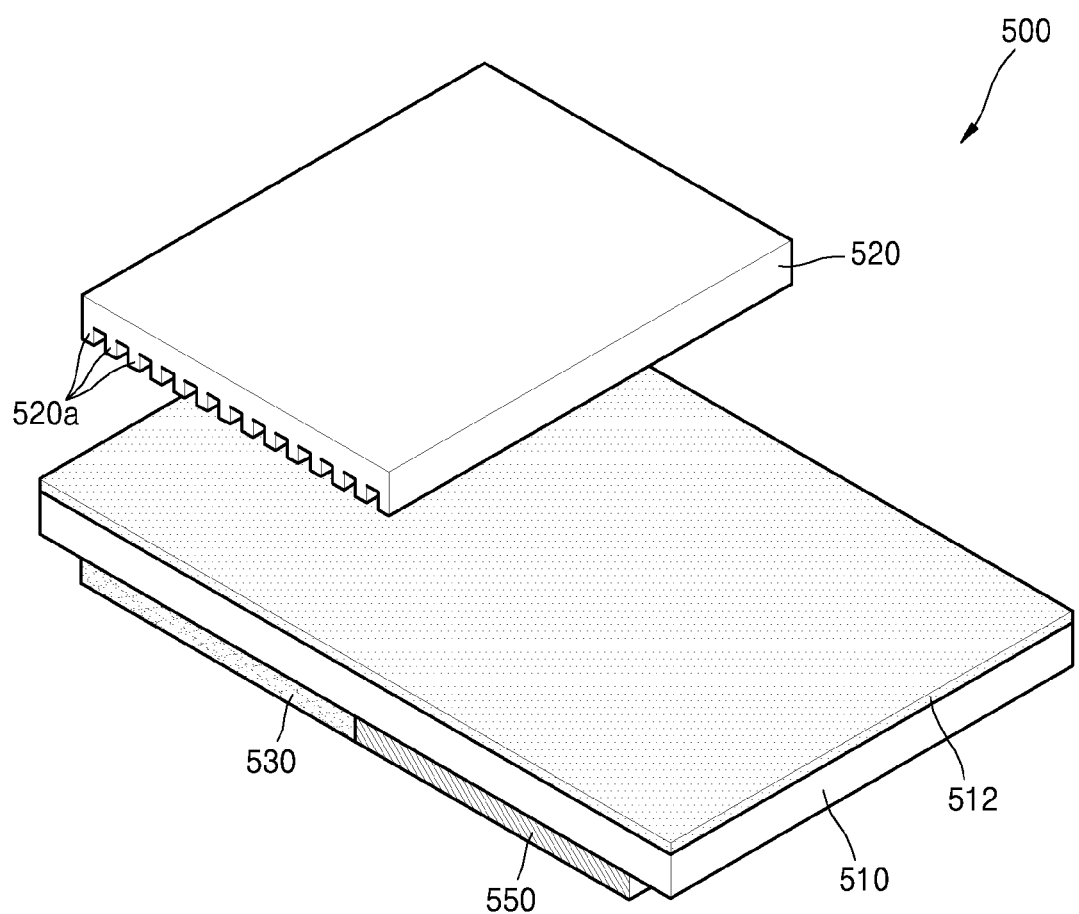
FIG. 15 is a perspective view illustrating yet another imprinting system according to an embodiment.

FIG. 15 is a perspective view illustrating yet another imprinting system 500 according to an embodiment. The following description mainly focuses on the differences from the above-described embodiments.

Referring to FIG. 15, the imprinting system 500 includes a resist layer 512, an imprint mold 520, a heat source 530 and a heat sink 550. The resist layer 512 may be formed on a substrate 510 and may include thermoplastic polymer. The imprint mold 520 is provided above the resist layer 512. The imprint mold 520 may have a flat panel shape and a mold pattern 520a is formed on a lower surface of the imprint mold 520. Although not illustrated in the drawings, an imprint mold having a roller shape may be provided above the resist layer 412. In the imprint mold having a roller shape, a mold pattern is formed on an outer circumferential surface thereof.

The heat source 530 is provided at the resist layer 512. In detail, the heat source 530 may be movably provided on a lower surface of the substrate 510 so as to heat a predetermined area of the resist layer 512. The heat sink 550 is at the side of the resist layer 512. In detail, the heat sink 550 may be movably provided on the lower surface of the substrate 510 so as to cool the area on which the imprint process is not performed. The patterning method using the imprinting system 500 of FIG. 15 is substantially the same as the patterning method using the imprinting system 100 of FIG. 1, except that the heat source 530 and the heat sink 550 are provided at the resist layer 512. Accordingly, the patterning method using the imprinting system 500 of FIG. 15 is briefly described in the following description.

Figure 16A:
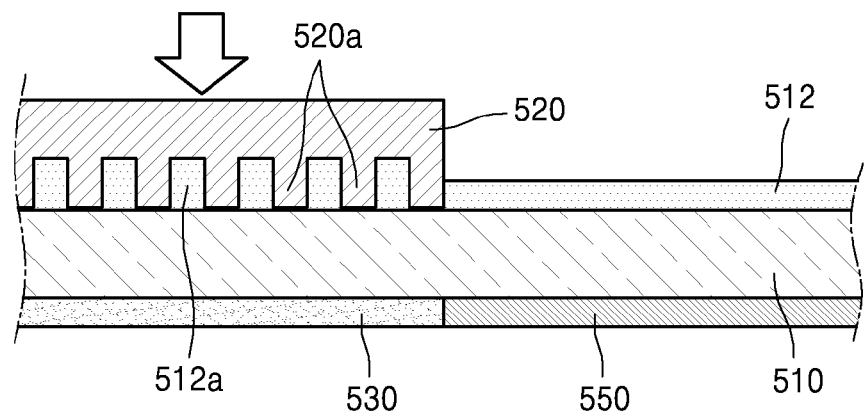
FIGS. 16A and 16B illustrate a patterning method using the imprinting system of FIG. 15.
Figure 16B:
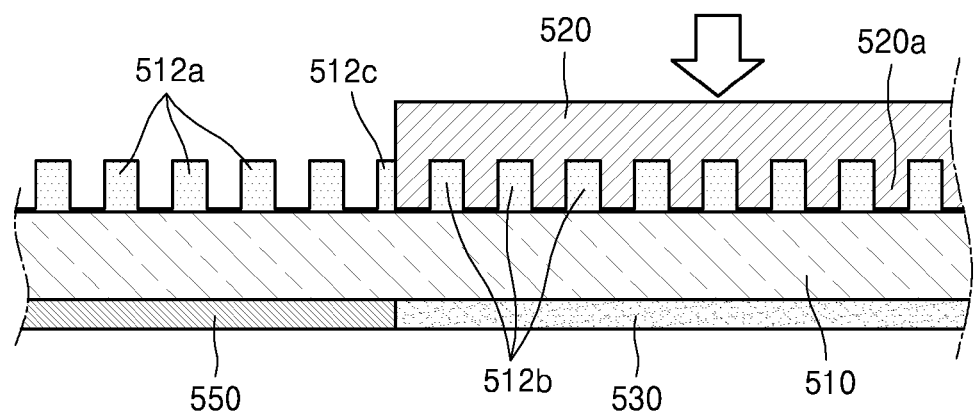

FIGS. 16A and 16B illustrate a patterning method using the imprinting system 500 of FIG. 15. Referring to FIG. 16A, after the imprint mold 520 is located above the first area A1 (refer to FIG. 2A) of the resist layer 512, the first area A1 is heated at a temperature higher than a predetermined temperature, for example, the glass transition temperature, by using the heat source 530 that is provided on the lower surface of the substrate 510. The heat source 530 may be provided at a position corresponding to the first area A1. The heat sink 550 may be provided at a position corresponding to the area other than the first area A1. Accordingly, deformation of the area other than the first area A1, due to thermal transfer, may be reduced or effectively prevented. Next, when the imprint mold 520 closely contacts and presses the first area A1, the resist layer 512 that is formed of thermoplastic polymer in the first area A1 is deformed due to the flow of a material. Accordingly, the first pattern 512*a* is formed in the first area A1. Next, the imprint mold 520 is detached from the first pattern 512*a*.

Referring to FIG. 16B, after the imprint mold 520 is moved to be located in the second area A2 (refer to FIG. 5A) of the resist layer 512, the second area A2 is heated at a temperature higher than a predetermined temperature, for example, the glass transition temperature, by using the heat source 530 that is provided on the lower surface of the substrate 510. The heat source 530 may be provided at a position corresponding to the second area A2. As described above, the first and second areas A1 and A2 may partially overlap each other. The heat sink 550 may be provided at a position corresponding to the area other than the second area A2. Accordingly, deformation of the area other than the second area A2, due to thermal transfer, may be reduced or effectively prevented. Next, as the imprint mold 520 closely contacts and presses the second area A2, a portion of the previously formed first pattern 512*a* in the overlapping area A3 in which the second area A2 overlaps the first area A1, and a portion of the remaining resist layer 512 in the area of the second area A2 that does not overlap the first area A1, are deformed due to the flow of a material, the second pattern 512*b* is formed. In this process, the portion of the previously formed first pattern 512*a* that is adjacent to and/or within the overlapping area A3 in which the first area A1 and the second area A2 are overlapped with each other is re-deformed and thus a third pattern 512*c* may be formed. Next, the imprint mold 520 is detached from the second pattern 512*b*.

Figure 17:
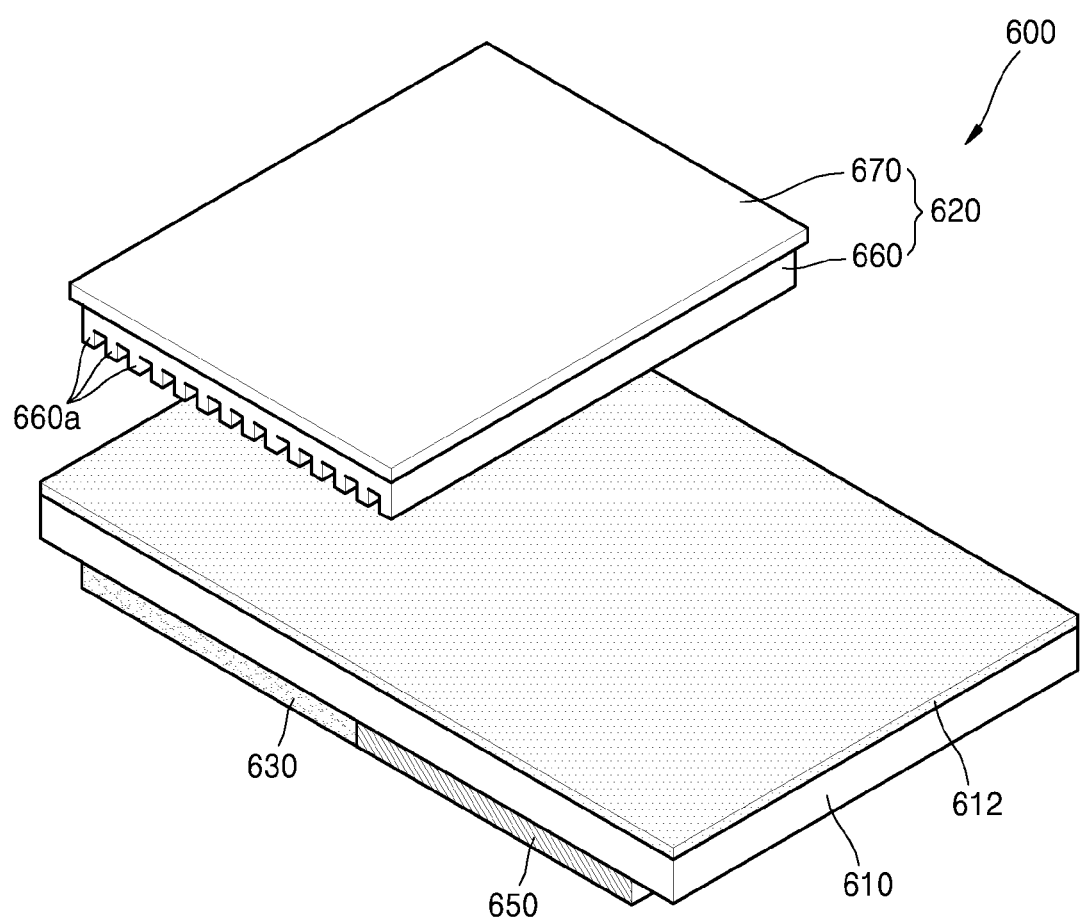
FIG. 17 is a perspective view illustrating yet another imprinting system according to an embodiment.

FIG. 17 is a perspective view illustrating yet another imprinting system 600 according to an embodiment. The following description mainly focuses on the differences from the above-described embodiments.

Referring to FIG. 17, the imprinting system 600 includes a resist layer 612, an imprint mold 620, a heat source 630 and a heat sink 650. The resist layer 612 may be formed on a substrate 610 and may include thermoplastic polymer. The imprint mold 620 is provided above the resist layer 612. The imprint mold 620 may include a support plate 670 having a flat panel shape and a soft stamp 660 attached to a lower surface of the support plate 670. A mold pattern 660*a* is formed on a lower surface of the soft stamp 660. The support plate 670 facilitates having the imprint mold 620 closely contact and press a predetermined area of the resist layer 612. To achieve this, the support plate 670 may include a rigid material. The support plate 670 may include SUS or quartz, but the present invention is not limited thereto and may include other various materials. The soft stamp 660 facilitates detachment of the imprint mold 620 from the predetermined area of the resist layer 612. To achieve this, the soft stamp 660 may include a material softer than the material of the support plate 670. The soft stamp 660 may include polyethylene terephthalate ("PET") or polycarbonate ("PC"), but the present invention is not limited thereto and may include other various materials.

The heat source 630 is provided at the resist layer 612. In detail, the heat source 630 may be movably provided on a lower surface of the substrate 610 so as to heat a predetermined area of the resist layer 612. Although not illustrated in the drawings, the heat source 630 may be provided at the imprint mold 620. The heat sink 650 is provided at the resist layer 612. In detail, the heat sink 650 may be movably provided on the lower surface of the substrate 610 so as to cool the area on which the imprint process is not performed. Alternatively, the heat sink 650 may not be provided. The patterning method using the imprinting system 600 of FIG. 17 is substantially the same as the patterning method using the imprinting system 500 of FIG. 15, except that the imprint mold 620 includes the support plate 670 and the soft stamp 660.

FIGS. 18 to 25 illustrate a patterning method using the imprinting system 600 of FIG. 17. The following description mainly focuses on the differences from the above-described embodiments.

Figure 18:
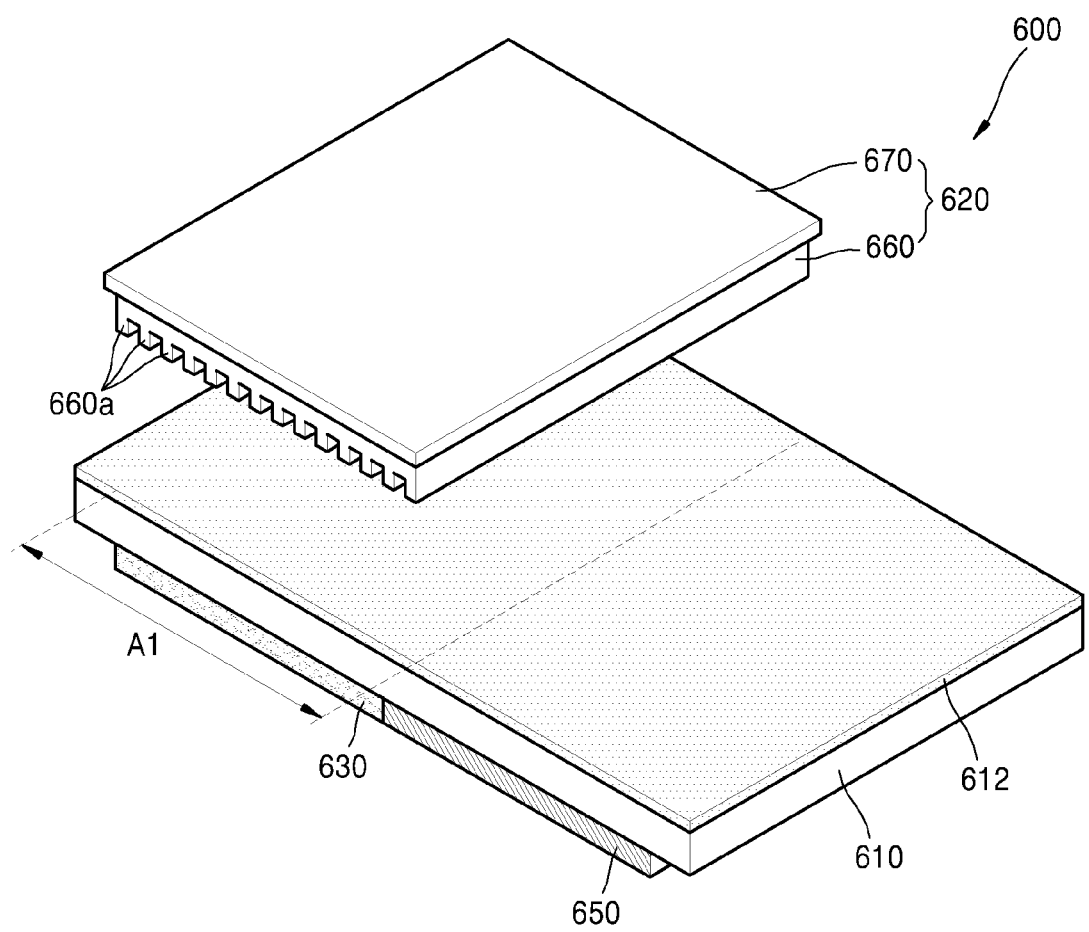
FIGS. 18 to 25 illustrate a patterning method using the imprinting system of FIG. 17.
Figure 19:
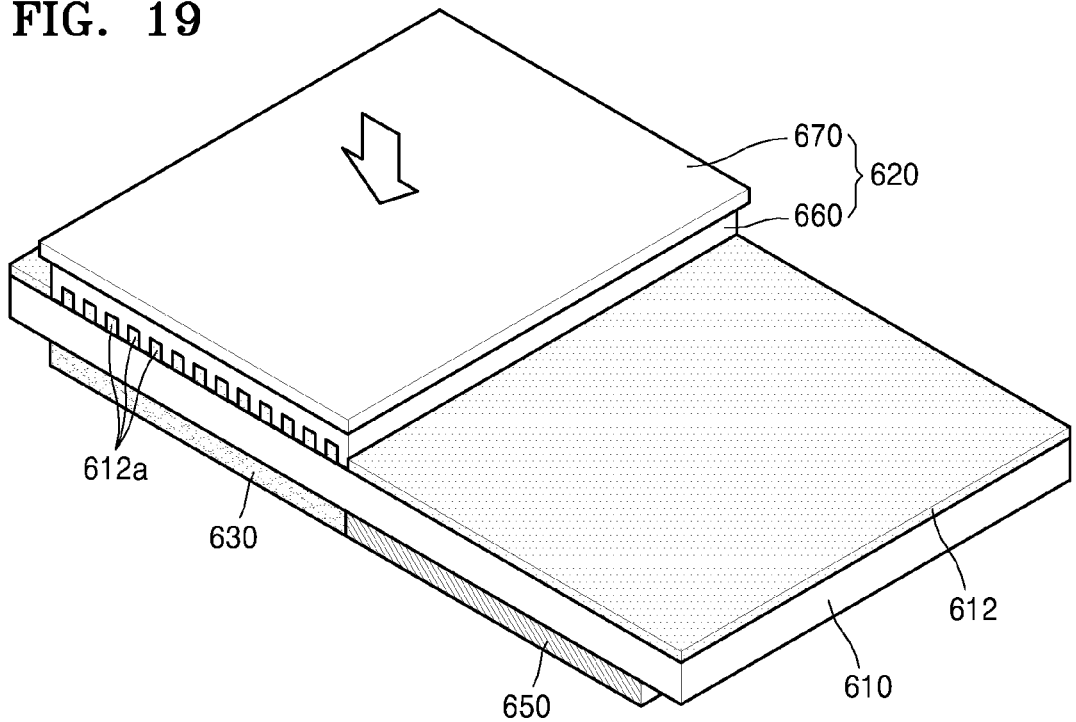

Referring to FIG. 18, the imprint mold 620 is located above the first area A1 of the resist layer 612. The heat source 630 is provided at a position corresponding to the first area A1 and the heat sink 650 is provided at a position corresponding to the area other than the first area A1. Referring to FIG. 19, after the first area A1 of the resist layer 612 is heated to a predetermined temperature by the heat source 630, the imprint mold 620 closely contacts and is pressed to the first area A1 and thus a first pattern 612*a* is formed. Since the support plate 670 is formed of a rigid material, the imprint mold 620 may easily closely contact and press the first area A1. Furthermore, the heat sink 650 may reduce or effectively prevent deformation of the area other than the first area A1 due to thermal transfer.

Figure 20:
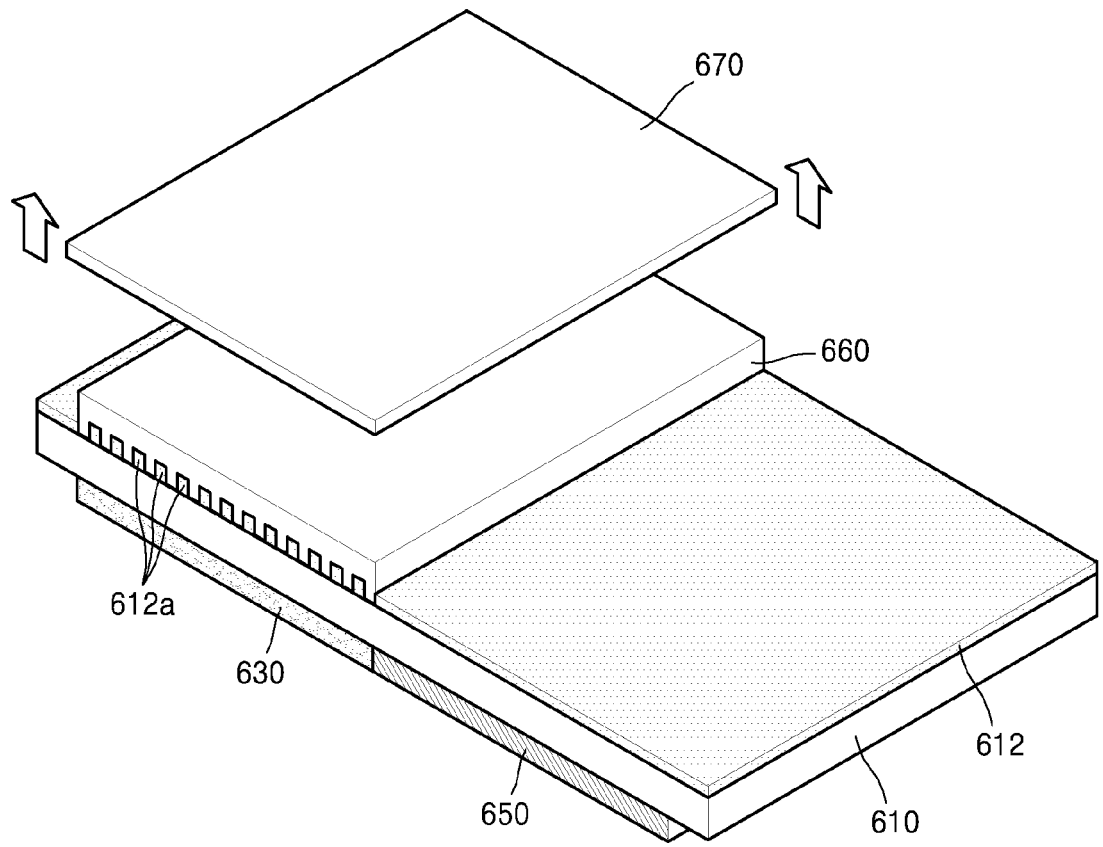
Figure 21:
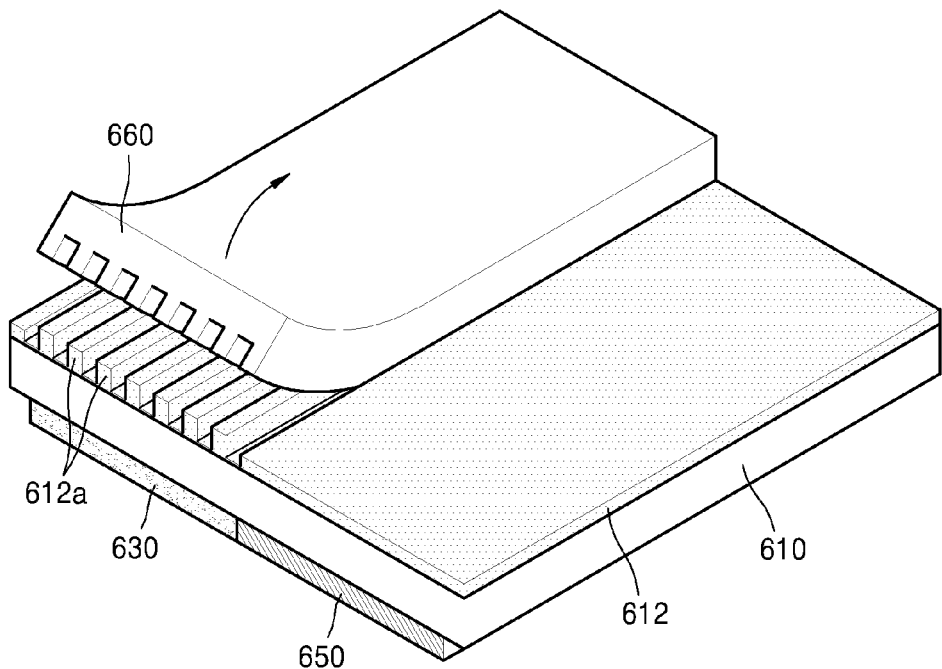

Referring to FIG. 20, the support plate 670 of the imprint mold 620 is detached from the soft stamp 660 and the soft stamp 660 remains in contact with the first pattern 612*a*. Next, referring to FIG. 21, the soft stamp 660 is detached from the first pattern 612*a*. Since the soft stamp 660 is formed of a soft material, the soft stamp 660 may be easily detached from the first pattern 612*a* by bending or peeling as indicated by the arrow.

Figure 22:
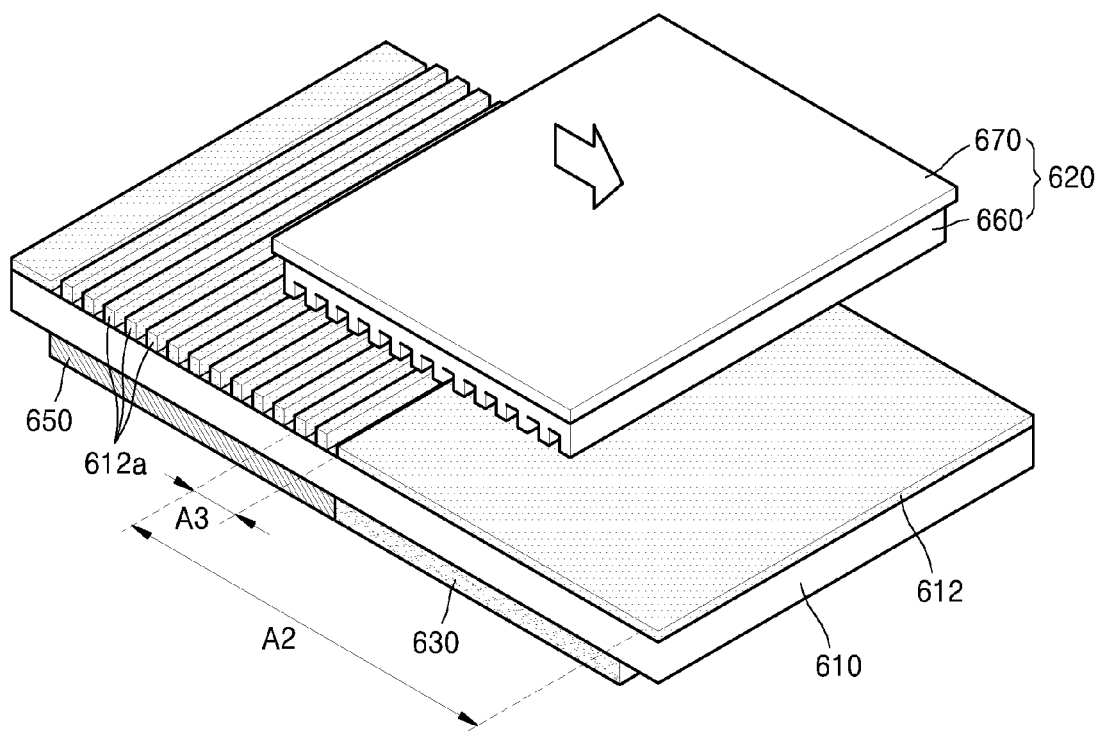

Referring to FIG. 22, the support plate 670 and the soft stamp 660 that are separated are coupled to each other and then the imprint mold 620 is located above the second area A2 of the resist layer 612. The heat source 630 is provided at a position corresponding to the second area A2 and the heat sink 650 is provided at a position corresponding to the area other than the second area A2. As described above, the first area A1 and the second area A2 are partially overlapped with each other. A portion of the first pattern 612a is formed in the overlapping area A3 in which the second area A2 overlaps the first area A1, and a remaining portion of the resist layer 612 is formed in the area of the second area A2 that does not overlap the first area A1.

Figure 23:
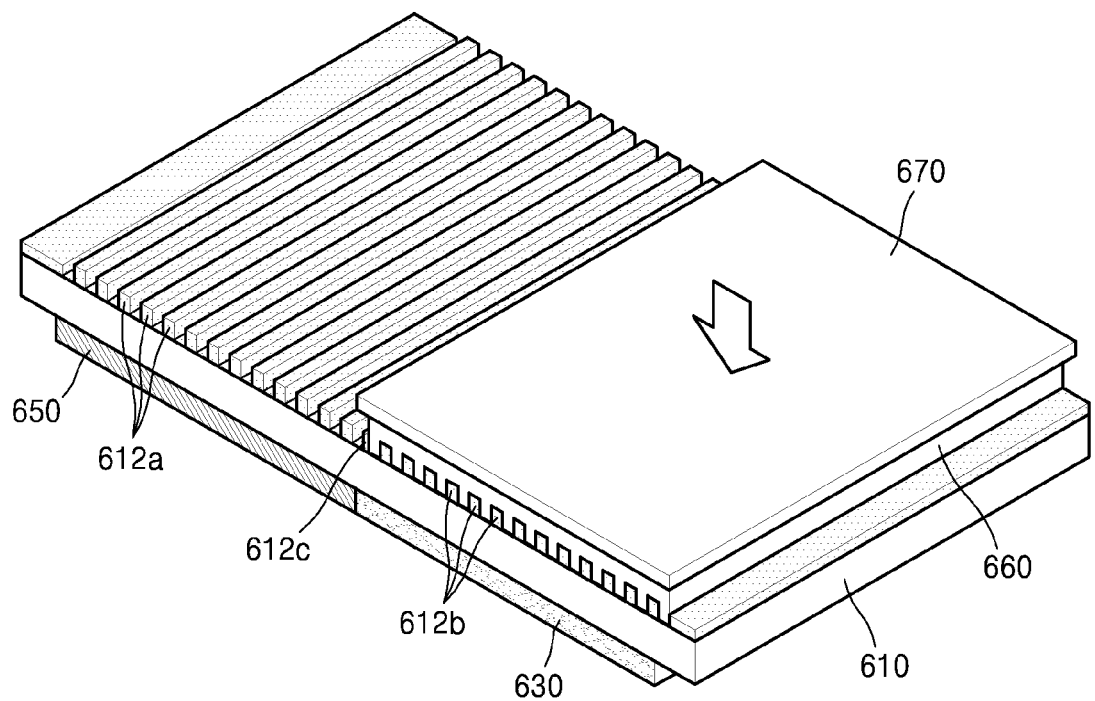

Referring to FIG. 23, after the second area A2 of the resist layer 612 is heated to a predetermined temperature by using the heat source 630, the imprint mold 620 closely contacts and is pressed to the second area A2 and thus a second pattern 612b is formed. Since the support plate 670 is formed of a rigid material, the imprint mold 620 may easily closely contact and press the second area A2. The heat sink 650 may reduce or effectively prevent deformation of the area other than the second area A2 due to thermal transfer. In this process, as a portion of the previously formed first pattern 612a that is adjacent to and/or within the overlapping area A3 in which the first area A1 and the second area A2 are overlapped with each other is re-deformed, a third pattern 612c may be formed.

Figure 24:
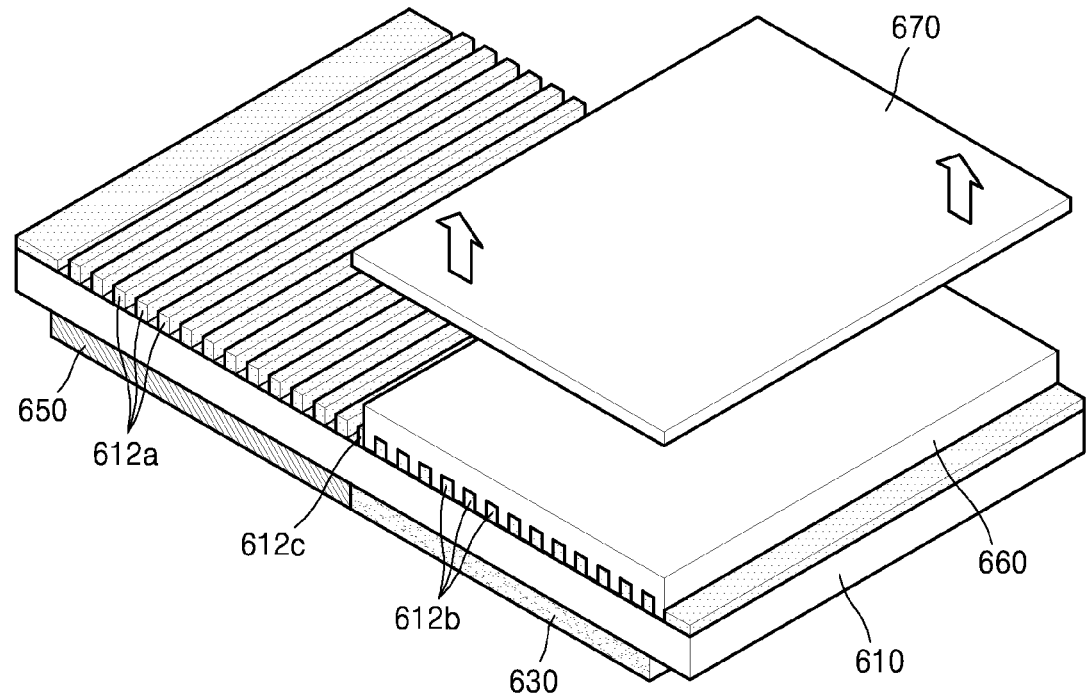
Figure 25:
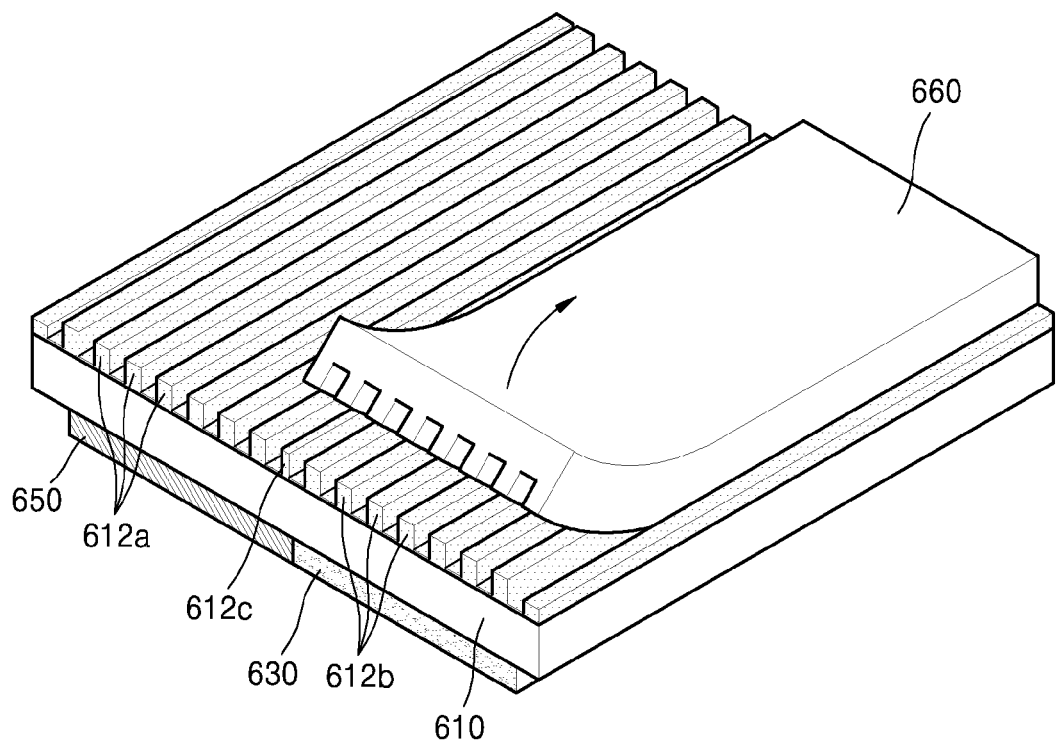

Referring to FIG. 24, the support plate 670 of the imprint mold 620 is detached from the soft stamp 660 and the soft stamp 660 remains in contact with the second pattern 612b. Referring to FIG. 25, the soft stamp 660 is detached from the second pattern 612b. Since the soft stamp 660 is formed of a soft material, the soft stamp 660 may be easily detached from the second pattern 612b.

According to the above-described embodiments, since a plurality of imprint processes are performed using a same (single) mold on a single resist layer that is formed of thermoplastic polymer, a large-size patterning process may be embodied. An area on which a pre-imprint process is performed and an area on which a post-imprint process is performed are partially overlapped with each other. Thermoplastic polymer forming the resist layer is re-deformed in the overlapping area, thereby forming a pattern. Accordingly, a pattern structure that has minimum or effectively no defects and has uniform physical characteristics over the whole planar area may be fabricated to have a large size by using a single, same mask or mold. The formed pattern structure may be used as a large-size master used in manufacturing a metal wire grid polarizer to be applied to, for example, a large LCD panel.

In the above-described embodiments, the resist layer is formed of thermoplastic polymer, that is, a material having viscosity that varies according to an external environmental factor, for example, heat. However, the present invention is not limited thereto and thus the resist layer may be formed of a material having viscosity that varies according to an external environmental factor other than heat. The external environmental factor other than heat may include, for example, ultraviolet ("UV"), power of hydrogen (pH) and/or a wavelength of light. In detail, the resist layer may be formed of a material having viscosity that varies as reverse crosslinking occurs when UV is applied, a material having viscosity that varies according to a pH condition, or a material having viscosity that varies according to a wavelength of irradiated light. The patterning method using an imprint mold that is performed where the resist layer is formed of a material having viscosity that varies according to an external environmental factor other than heat is substantially the same as the above-described patterning method using an imprint mold, except that UV, pH or a wavelength of light is used instead of heat as an external environmental factor.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A patterning method using an imprint mold, for forming an imprinted pattern structure, the patterning method comprising:
   providing a resist layer from which the imprinted pattern structure is formed;
   performing a first imprint process on a first area of the resist layer by using the imprint mold to form a first pattern of the pattern structure through deformation of the resist layer in the first area; and
   performing a second imprint process on a second area of the resist layer by using the imprint mold to form a second pattern of the pattern structure through deformation of the resist layer in the second area,
   wherein
   the first and second areas are overlapped with each other in a third area of the resist layer, and
   the performing the second imprint process deforms a first portion of the first pattern in the third area to form the second pattern.

2. The patterning method of claim 1, wherein the performing the second imprint process deforms a second portion of the first pattern adjacent to the third area to form a third pattern of the pattern structure, different from the first and second patterns.

3. The patterning method of claim 2, wherein
   the first and second patterns has a same width and a same pitch, and
   the third pattern has a width less than the pitch of each of the first and second patterns.

4. The patterning method of claim 1, wherein the resist layer comprises thermoplastic polymer.

5. The patterning method of claim 4, wherein
   performing the first imprint process comprises:
      heating the first area to a predetermined temperature,
      contacting and pressing the imprint mold to the resist layer in the first area, and
      detaching the imprint mold from the resist layer in the first area, and
   performing the second imprint process comprises:
      heating the second area to the predetermined temperature,
      contacting and pressing the imprint mold to the resist layer in the second area, and
      detaching the imprint mold from the resist layer in the second area.

6. The patterning method of claim 5, wherein the first or second area of the resist layer is heated to a glass transition temperature or higher.

7. The patterning method of claim 5, wherein, in the performing the second imprint process, the first portion of the first pattern in the third area is re-deformed due to heat and pressure to form the second pattern.

8. The patterning method of claim 5, wherein the heating the first and second areas comprises a heat source which is on the imprint mold or the resist layer, heating the first and second areas of the resist layer.

9. The patterning method of claim 5, further comprising providing a heat sink in an area of the resist layer other than the area in which the first or second imprint process is performed, while the first or second imprint process is performed.

10. The patterning method of claim 5, wherein
the imprint mold has a flat panel shape, and
a mold pattern is defined on a surface of the imprint mold.

11. The patterning method of claim 10, wherein the performing the first or second imprint process respectively comprises:
 locating the imprint mold above the first or second area of the resist layer;
 heating the first or second area to the predetermined temperature;
 contacting and pressing the imprint mold to the resist layer in the first or second area, to form the first or second pattern; and
 detaching the imprint mold from the first or second pattern.

12. The patterning method of claim 5, wherein
the imprint mold has a roller shape, and
a mold pattern is defined on an outer circumferential surface of the roller shape imprint mold.

13. The patterning method of claim 12, wherein the performing the first or second imprint process respectively comprises:
 locating the roller shape imprint mold above the first or second area of the resist layer;
 heating the first or second area to the predetermined temperature;
 contacting and pressing the roller shape imprint mold to the resist layer in the first or second area; and
 moving the roller shape imprint mold in one direction while contacting and pressing the roller shape imprint mold to the resist layer and rotating the roller shape imprint mold, to form the first or second pattern.

14. The patterning method of claim 5, wherein the imprint mold comprises:
 a support plate having a flat panel shape; and
 a soft stamp attached on the support plate, comprising a material softer than a material of the support plate, and comprising a mold pattern defined on a surface thereof.

15. The patterning method of claim 14, wherein the performing the first or second imprint process respectively comprises:
 locating the imprint mold above the first or second area of the resist layer;
 heating the first or second area to the predetermined temperature;
 via the support plate, contacting and pressing the imprint mold to the resist layer in the first or second area, to form the first or second pattern;
 separating the support plate from the soft stamp to maintain the soft stamp in contact with the first or second pattern; and
 detaching the soft stamp from the first or second pattern.

16. The patterning method of claim 1, wherein the providing the resist layer comprises forming the resist layer on a substrate.

17. The patterning method of claim 1, wherein the resist layer comprises a material having viscosity which varies according to an external environmental factor other than heat.

18. The patterning method of claim 17, wherein the external environmental factor comprises ultraviolet, power of hydrogen or a wavelength of light.

\* \* \* \* \*